(12) United States Patent
Amin et al.

(10) Patent No.: US 10,649,588 B2
(45) Date of Patent: May 12, 2020

(54) PIEZOELECTRIC FILM STRUCTURES AND SENSORS AND DISPLAY ASSEMBLIES USING SAME

(71) Applicant: CORNING INCORPORATED, Corning, NY (US)

(72) Inventors: Jaymin Amin, Corning, NY (US); Shandon Dee Hart, Corning, NY (US); Karl William Koch, III, Elmira, NY (US); Charles Andrew Paulson, Painted Post, NY (US); William James Miller, Horseheads, NY (US); Rostislav Vatchev Roussev, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 179 days.

(21) Appl. No.: 15/518,597

(22) PCT Filed: Oct. 14, 2015

(86) PCT No.: PCT/US2015/055409
§ 371 (c)(1),
(2) Date: Apr. 12, 2017

(87) PCT Pub. No.: WO2016/061155
PCT Pub. Date: Apr. 21, 2016

(65) Prior Publication Data
US 2017/0228072 A1     Aug. 10, 2017

Related U.S. Application Data

(60) Provisional application No. 62/185,892, filed on Jun. 29, 2015, provisional application No. 62/063,441, filed on Oct. 14, 2014.

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *H01L 41/042* (2013.01);
(Continued)

(58) Field of Classification Search
None
See application file for complete search history.

(56) References Cited

U.S. PATENT DOCUMENTS 6,936,837 B2   8/2005   Yamada et al.
7,482,737 B2   1/2009   Yamada et al.
(Continued)

FOREIGN PATENT DOCUMENTS

CN     102207793 A   10/2011
CN     203376710 U    1/2014
(Continued)

OTHER PUBLICATIONS

Dumitru et al,. "Aluminum nitride films for optical applications", 1996 International Semiconductor Conference, 1997, pp. 641-644.
(Continued)

*Primary Examiner* — Stephen T. Reed

(57) ABSTRACT

The disclosure is directed to piezoelectric film structures and sensors, and display assemblies using same. The piezoelectric film structure is transparent and includes: a substrate; a bottom optical layer disposed on or above the substrate; a bottom conducting layer disposed on or above the bottom optical layer; at least one piezoelectric layer disposed on or above the bottom conducting layer; a top conducting layer disposed on or above the at least one piezoelectric layer; and a top optical layer disposed on or above the top conducting
(Continued)

layer. The sensor includes the piezoelectric film structure electrically connected to a signal processing system. The display assembly includes the sensor operably arranged relative to a display device. The piezoelectric film structures and sensors can be configured to determine one or more touch-sensing features associated with a touch event.

20 Claims, 16 Drawing Sheets

(51) Int. Cl.
*H01L 41/08* (2006.01)
*H01L 41/113* (2006.01)
*H01L 41/187* (2006.01)
*H01L 41/04* (2006.01)
*H01L 41/047* (2006.01)
*G06F 3/043* (2006.01)

(52) U.S. Cl.
CPC ........ *H01L 41/0478* (2013.01); *H01L 41/081* (2013.01); *H01L 41/1132* (2013.01); *H01L 41/187* (2013.01); *G06F 3/0436* (2013.01); *G06F 2203/04105* (2013.01)

(56) References Cited

U.S. PATENT DOCUMENTS

| | | | |
|---|---|---|---|
| 9,359,261 | B2 | 6/2016 | Bellman et al. |
| 9,366,784 | B2 | 6/2016 | Bellman et al. |
| 9,820,055 | B2 | 11/2017 | Babayoff et al. |
| 2004/0263483 | A1 | 12/2004 | Aufderheide |
| 2006/0144154 | A1* | 7/2006 | Ueno .................. G01L 1/16 73/723 |
| 2006/0250534 | A1 | 11/2006 | Kutscher et al. |
| 2007/0030569 | A1* | 2/2007 | Lu .................. C03C 17/3435 359/586 |
| 2013/0082970 | A1 | 4/2013 | Frey et al. |
| 2014/0220327 | A1* | 8/2014 | Adib .................. C03C 17/36 428/217 |
| 2014/0331791 | A1 | 11/2014 | Ishii et al. |
| 2014/0334006 | A1 | 11/2014 | Adib et al. |
| 2015/0284840 | A1 | 10/2015 | Henn et al. |
| 2015/0287905 | A1* | 10/2015 | Umeda .............. C23C 14/0641 310/313 R |
| 2015/0322270 | A1 | 11/2015 | Amin et al. |
| 2015/0355382 | A1 | 12/2015 | Henn et al. |
| 2016/0018893 | A1* | 1/2016 | Choi .................. G06F 3/016 345/177 |
| 2017/0131160 | A1* | 5/2017 | Lu .................. G01L 1/16 |
| 2017/0131591 | A1* | 5/2017 | Rantala .................. C08L 83/06 |

FOREIGN PATENT DOCUMENTS

| | | |
|---|---|---|
| CN | 103682078 A | 3/2014 |
| JP | 63029259 A | 2/1988 |
| JP | 05248971 A | 9/1993 |
| JP | 2009149953 A | 7/2009 |
| JP | 2010211482 A | 9/2010 |
| JP | 2014191575 A | 10/2014 |
| TW | 201117071 A | 5/2011 |
| WO | 2015179739 A1 | 11/2015 |

OTHER PUBLICATIONS

Ishihara et al., "Control of preferential orientation of AlN films prepared by the reactive sputtering method", Thin Solid Films, 316, 1998, pp. 152-157.

Akiyama et al, "Influence of oxygen concentration in sputtering gas on piezoelectric response of aluminum tide thin films", AIP Applied Physics Letters 93, pp. 021903-1-021903-3 (2008).

Ababneh et al, "The influence of sputter deposition parameters on piezoelectric and mechanical properties of AlN thin films", Materials Science and Engineering B 172 (2010), pp. 253-258.

Artieda et al., "Highly piezoelectric AlN thin films grown on amorphous, insulating substrates", Journal of Vacuum Science & Technology A 28, (2010), pp. 390-393.

Crisman et al., "Large Pyroelectric Response from Reactively Sputtered Aluminum Nitride Thin Films", University of Rhode Island, DigitalCommons@URI, Chemical Engineering Faculty Publications, Electrochemical and Solid-State Letters, (2005), vol. 8, Issue 3, pp. H31-H32.

Zheng et al., "Aluminum nitride thin film sensor for force, acceleration, and acoustic emission sensing", Journal of Vacuum Science & Technology A, vol. 11, No. 5, Sep./Oct. 1993, pp. 2437-2446.

Ramadan et al., "A review of piezoelectric polymers as functional materials for electromechanical transducers", Smart Materials and Structures, vol. 23, No. 3, (2014).

European Patent Application No. 15790335.2 Office Action dated Oct. 19, 2018; 5 pages; European Patent Office.

English Translation of CN201580067972.5 Office Action dated Oct. 29, 2018; 18 pages; Chinese Patent Office.

English Translation of TW104133744 Office Action and Search Report dated Jul. 3, 2019, Taiwan Patent Office, 3 Pgs.

Japanese Patent Application No. 2017519827; Machine Translation of the Office Action dated Oct. 2, 2019; Japan Patent Office; 3 Pgs.

* cited by examiner

PIEZOELECTRIC FILM STRUCTURES AND SENSORS AND DISPLAY ASSEMBLIES USING SAME

CROSS-REFERENCE TO RELATED APPLICATIONS

This application claims the benefit of priority under 35 U.S.C. § 371 of International Patent Application Serial No. PCT/US15/55409, filed on Oct. 14, 2015, which in turn, claims the benefit of priority of U.S. Provisional Patent Application Ser. No. 62/185,892 filed on Jun. 29, 2015 and U.S. Provisional Patent Application Ser. No. 62/063,441 filed on Oct. 14, 2014, the contents of each of which are relied upon and incorporated herein by reference in their entireties.

FIELD

The present disclosure relates to film structures, and in particular to piezoelectric film structures and sensors, and a display assemblies using same.

BACKGROUND

Smart phones and similar display-based devices typically have a touch sensor integrated with the display or the display cover of the device. The touch sensor provides touch-sensing functionality by sensing the position (and in some cases the movement) of a user's touch and uses this information to carry out one or more device functions.

It is also desirable for display-based devices to have additional functionality beyond mere touch-location sensing. Other functionalities include a pressure sensing, acoustic sensing, acceleration sensing and vibrational energy harvesting. It may also be desirable for the display-based device to have multiple touch-sensing functionalities.

Besides touch-sensing features, the covers for display-based devices need to be durable, i.e., scratch-resistant and break-resistant, while also having strong optical performance characteristics (e.g., high optical transmission, low reflectivity, low distortion, good color, etc.).

SUMMARY

An aspect of the disclosure is a piezoelectric film structure that is substantially transparent to visible light and that includes: a transparent substrate; a transparent bottom optical layer disposed on or above the transparent substrate and that includes one or more bottom dielectric layers; a transparent bottom conducting layer disposed on or above the transparent bottom optical layer; at least one transparent piezoelectric layer disposed on or above the transparent bottom conducting layer; a transparent top conducting layer disposed on or above the at least one transparent piezoelectric layer; and a transparent top optical layer disposed on or above the transparent top conducting layer and that includes one or more top dielectric layers.

Another aspect of the disclosure is the piezoelectric film structure described above, wherein: the transparent top and bottom conducting layers each include one of ITO, AZO or a thin metal; and the transparent piezoelectric layer includes at least one piezoelectric material selected from the group of piezoelectric materials comprising: CdS, CdSe, ZnS, ZnTe, ZnO, AlN, oxygen-doped AlN, barium titanate ($BaTiO_3$), a lead-free niobate, a lead-zirconate-titanate (PZT), lead-lanthanum-zirconate-titanate (PLZT), and a lead-free titanate.

Another aspect of the disclosure is the piezoelectric film structure described above, wherein the transparent piezoelectric layer consists of oxygen-doped AlN having up to 20 atomic % oxygen.

Another aspect of the disclosure is the piezoelectric film structure described above, wherein the at least one piezoelectric layer has a thickness $TH_{50}$ in the range from 50 nm≤$TH_{50}$≤5000 nm.

Another aspect of the disclosure is the piezoelectric film structure described above, wherein the transparent top optical layer includes at least one material selected from the group of materials comprising: $SiN_x$, $SiO_xN_y$, $AlN_x$, $AlO_xN_y$, $SiAl_xO_yN_z$, $SiO_2$, $SiO_x$, $Al_2O_3$, and $AlO_x$.

Another aspect of the disclosure is the piezoelectric film structure described above and having at least one of the following properties:
  i) a hardness measured by Berkovich nanoindentation greater than 8 GPa; and
  ii) a photopic average reflectance less than 2%, and an angular color shift in the range of 0 to 60 degrees light incidence of less than 5 in either a* or b* coordinates.

Another aspect of the disclosure is a piezoelectric sensor system that includes the piezoelectric film structure described above, wherein the piezoelectric film structure generates an output signal in response to at least one touch event on the transparent top optical layer; and a signal processing system electrically connected to the bottom and top transparent conducting layers and that receives and processes the output signal to determine at least one touch-sensing feature associated with the at least one touch event.

Another aspect of the disclosure is a piezoelectric sensor system, wherein the at least one touch-sensing feature includes for each touch event: a touch location of the touch event, an amount of pressure, an amount of force, a duration, a size, a shape, an acceleration, acoustic sensing, and vibrational energy harvesting.

Another aspect of the disclosure is the piezoelectric sensor system as described above, wherein at least one of the transparent bottom conducting layer, the at least one transparent piezoelectric layer and the transparent top conducting layer is patterned to provide touch-location sensing for the at least one touch event.

Another aspect of the disclosure is a display assembly that includes: a device having a user interface; and the piezoelectric sensor system described above operably disposed relative to the device so that user interface can be viewed through the piezoelectric film structure of the piezoelectric sensor system.

Another aspect of the disclosure is a display assembly as described above, wherein the device is a display system that emits light, wherein the light defines the user interface and travels through the piezoelectric film structure.

Another aspect of the disclosure is a piezoelectric film sensor having touch-sensing capability in response to a touch event at a touch location. The piezoelectric film sensor includes: first and second transparent conducting layers that define first and second electrodes; at least one transparent piezoelectric layer interposed between the first and second electrodes; wherein the first electrode, the second electrode and the at least one transparent piezoelectric layer are configured to provide touch-location functionality and to generate an output signal in response to the touch event; first and second transparent optical layers respectively disposed adjacent the first and second electrodes opposite the piezoelectric layer, with the first transparent optical layer defining an uppermost surface; a substrate disposed adjacent the second optical layer; and a signal processing system electrically connected to the bottom and top transparent conducting layers and configured to process the output signal to determine at least one touch-sensing feature associated with the at least one touch event.

Another aspect of the disclosure is the piezoelectric film sensor as described above, wherein the at least one touch-sensing feature includes one or more of: a touch location of the touch event, an amount of pressure, an amount of force, a duration, a size, a shape, an acceleration, acoustic sensing and vibrational energy harvesting.

Another aspect of the disclosure is the piezoelectric film sensor as described above, wherein the transparent piezoelectric layer consists of oxygen-doped AlN having up to 20 atomic % oxygen.

Another aspect of the disclosure is the piezoelectric film sensor as described above, wherein the output signal includes piezoelectric and pyroelectric components, and wherein the signal processing system includes one or more filters arranged to filter the output signal to separate the piezoelectric component from the pyroelectric component.

Another aspect of the disclosure is the piezoelectric film sensor as described above, wherein the at least one piezoelectric layer includes either multiple vertically stacked piezoelectric layers or multiple horizontally stacked piezoelectric layers.

Another aspect of the disclosure is the piezoelectric film sensor as described above, wherein the at least one piezoelectric layer is constituted by a single continuous piezoelectric layer, wherein the first electrode is closer to the uppermost surface than the second electrode, and wherein the first electrode comprises spaced apart and electrically isolated regions that are independently electrically addressable via electrical connections to the signal processing system.

Another aspect of the disclosure is a display assembly that includes: a device having a user interface; and the piezoelectric sensor system as described above operably disposed relative to the device so that user interface can be viewed through the piezoelectric film structure of the piezoelectric sensor system.

Another aspect of the disclosure is the display assembly as described above, wherein the device is a display system that emits light through the surface, wherein the light defines the user interface and travels through the piezoelectric film structure.

Another aspect of the disclosure is a method of providing piezoelectric touch sensing for a device having a user interface. The method includes: interfacing a piezoelectric film sensor having touch-sensing capability with the device so that the user interface can be viewed through a transparent piezoelectric touch-sensing (PETS) piezoelectric film structure of piezoelectric film sensor; causing a touch event by touching a surface of the piezoelectric film sensor at a touch location that corresponds to a location of the user interface, thereby causing the PETS piezoelectric film structure to generate an output signal; and processing the output signal to determine at least one touch-sensing feature associated with the touch event.

Another aspect of the disclosure is the method as described above, wherein the at least one touch-sensing feature includes one or more of: the touch location, an amount of pressure applied at the touch location, an amount of force applied at the touch location, a duration of the touch event, a size of the touch location, a shape of the touch location, an acceleration, acoustic sensing, and vibrational energy harvesting.

Another aspect of the disclosure is a display assembly that includes: an image-forming display that generates visible light to form a display image; a transparent piezoelectric film structure operably arranged relative to the image-forming display so that display image is viewable through the transparent piezoelectric film structure; and wherein the piezoelectric film structure has a light transmittance of the visible light of greater than 20%, a hardness measured by Berkovich nanoindentation greater than 8 GPa, and an angular color shift in the range of 0 to 60 degrees light incidence of less than 5 in either a* or b* coordinates.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiments, and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation. The terms "bottom" and "top" are used below for the sake of reference and for ease of illustration and discussion and are not intended to be limiting as to position or orientation.

In the discussion below, the term "transparent" in connection with the piezoelectric film structures and the various layers therein refers to light in the visible wavelength range (i.e., visible light), and does not necessarily mean perfectly transparent, and includes situations where there is some (and even substantial) optical absorption, scattering, etc. In an example, the term transparent means having a sufficient optical transmittance to allow a person to view an object or objects, such as a user interface, through the piezoelectric film structure. It is noted that in certain cases where a user interface of a device is constituted by a light-emitting display, the optical transmittance of the piezoelectric structure through which the user interface is viewed can be less than that where the user interface is non-light-emitting. In various non-limiting examples, the piezoelectric film structures disclosed herein have an optical transmittance of at least 20%, or at least 50%, or at least 80%, or at least 90%, or at least 95%, or at least 98% percent taken as a photopic average.

Piezoelectric Film Structure

Figure 1:
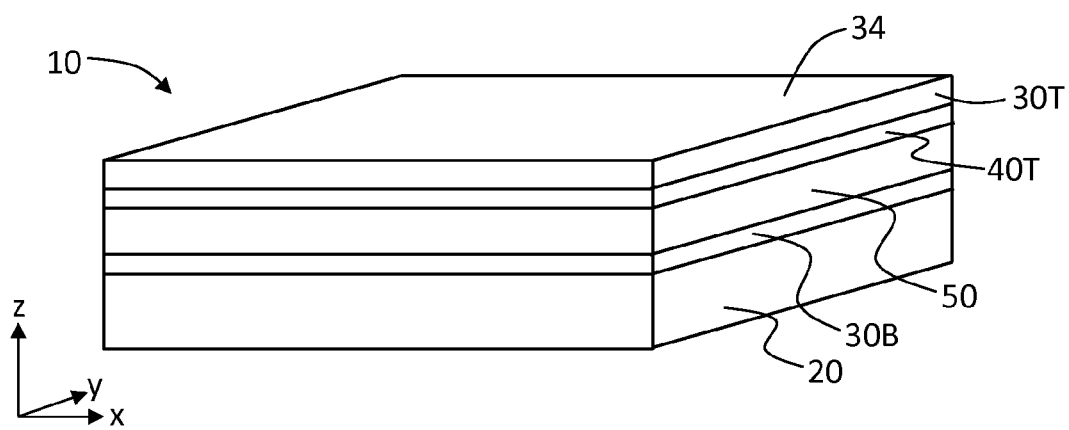
FIG. 1 is an elevated view of an example piezoelectric film structure according to the disclosure.
Figure 2:
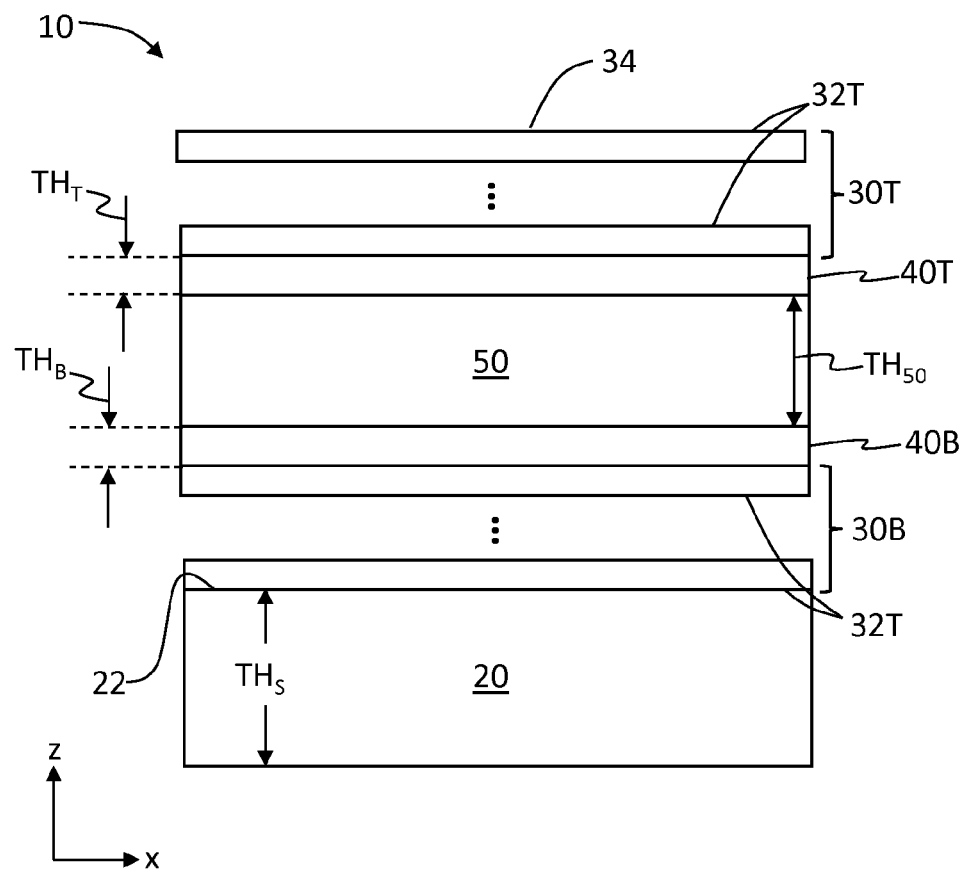
FIG. 2 is a cross-sectional view of the piezoelectric film structure of FIG. 1.

FIG. 1 is an elevated view of an example piezoelectric (PE) film structure 10 according to the disclosure, while FIG. 2 is a cross-sectional view of the PE film structure of FIG. 1. The PE film structure 10 includes, in order in the +z direction: a transparent substrate 20, a first or bottom transparent optical layer ("bottom optical layer") 30B, a first or bottom transparent conductor layer ("bottom conductor layer") 40B, a transparent piezoelectric layer ("piezoelectric layer") 50, a second or top transparent conductor layer ("top conductor layer") 40T, and a second or top transparent optical layer ("top optical layer") 30T. The bottom and top optical layers 30B and 30T can respectively include one or more dielectric layers 32B and 32T. The one or more bottom and top dielectric layers 32B and 32T can be graded-index or a combination (stack) of high-index/low-index layers configured to perform an anti-reflection function.

In an example, top optical layer 30T has an upper surface 34 that defines a touch surface. In an example, top optical layer 30T has a number of performance-related properties, as described in for example U.S. patent application Ser. No. 14/480,898, entitled "Low-color scratch-resistant articles with a multilayer optical film," filed on Sep. 9, 2014, and which is incorporated by reference herein. Example performance-related properties include one or more of: a high hardness, a high scratch resistance, a high abrasion resistance, a high optical transparency, a low optical reflectance, and good color (i.e., a low color shift). In an example, top optical layer 30T has a hardness as measured using Berkovich indentation of greater than 8 GPa, or greater than 10 GPa, or greater than 12, or greater than 14 GPa.

In an example, top optical layer 30T includes multiple dielectric layers 32T wherein some of the dielectric layers are high-index layers having a refractive index greater than about 1.6, or greater than about 1.7, or greater than about 1.8, or greater than about 1.9. Further in various examples, the high-index dielectric layers 32T constitute more than 35%, more than 40%, more than 50%, more than 60%, or more than 70% of the thickness of the top optical layer 30T. In an example, the high-index layers 32T may be made from at least one of $SiN_x$, $SiO_xN_y$, AlN, $AlO_xN_y$, $SiAl_xO_yN_z$, or other materials with a refractive index in the range of about 1.7 to 2.3. The other dielectric layers 32T may be made of low-index materials, such as $SiO_2$, $SiO_x$, $SiO_xN_y$, $Al_2O_3$, AlO, $AlO_xN_y$, $SiAlO_xN_y$, or other materials with a refractive indices in the range of about 1.3 to 1.7.

In various examples, top optical layer 30T has a total light transmittance of greater than 80%, of greater than 90%, of greater than 95%, or of greater than 98% taken as a photopic average in the visible light range.

Also in various examples, the top optical layer 30T has a reflectance of less than 20%, of less than 10%, of less than 5%, of less than 4%, of less than 3%, of less than 2%, of less than 1%, of less than 0.7%, of less than 0.5%, or of less than 0.4% taken as a photopic average in the visible light range. In some embodiments, the entire coated surface of the film structure 10 (including all optical, electrical, and piezoelectric layers combined) may exhibit these low reflectance values.

In an example, the top optical layer 30T exhibits a low color shift with viewing angle, for viewing angles in the range from 5° to 60°. In various example, the color shift is less than 10.0, or less than 4.0, or less than 3.0, or less than 2.0 in both a* and b* using D65 or F2 illumination. In other various example, the color shift defined by $[(a^*)^2+(b^*)^2]^{1/2}$ is less than 10, less than 5, less than 4, or less than 3 using D65 or F2 illumination. In some embodiments, the entire coated surface of the film structure (including all optical, electrical, and piezoelectric layers combined) may exhibit these low color shift values.

In another example, the top optical layer 30T has a high abrasion resistance when subjected to Taber Abrasion testing. In an example, the top optical layer 30T has a high abrasion resistance as measured using the Garnet sandpaper abrasion test.

In an example, the top optical layer 30T has an RMS surface roughness that is less than about 2 nm, less than about 1 nm, less than about 0.5 nm, or less than about 0.3 nm.

In various examples, the substrate 20 includes at least one of a glass, an ion-exchanged glass, a glass-ceramic, a ceramic, spinel, mullite, $ZrO_2$, sapphire or diamond.

In various examples, the bottom and top conductor layers 40B and 40T can comprise ITO, AZO, thin metal, etc., and in an example have respective thicknesses $TH_B$ and $TH_T$ in the range from 2 nm to 500 nm.

In an example, transparent substrate 20 includes an upper surface 22 and in an example is crystalline and has thermal conductivity K substantially higher than that of glass, preferably κ>5 W/m·K. In one example, substrate 20 is made of a sapphire crystal. In another example, substrate 20 is made of glass, such as a chemically strengthened glass. An example of a chemically strengthened glass substrate 20 is one formed by ion exchange. Other example materials for substrate 20 include diamond, polymer, flexible glass, sapphire or other transparent material capable of supporting the above-described layers. In an example, substrate upper surface 22 has low roughness. Substrate 20 has a thickness $TH_S$.

The sheet resistance of the bottom and top conductor layers 40B and 40T may be less than about 100 ohms/square, 50 ohms/square, 20 ohms/square, or 10 ohms/square. The bottom and top conductor layers 40B and 40T may each be in the form of a film that is contacted with thin metal lines, wires, or traces. Each of the bottom and top conductor layers 40B and 40T may comprise two materials, such as a continuous or patterned ITO layer with a high surface coverage of the substrate, with the ITO layer electrically contacted with (or whose conductivity is augmented by) a grid of fine metal lines or wires (see, e.g., FIG. 11A and wires 82T). The grid of fine metal lines may also aid in creating a sensor grid with a localized sensing function, e.g. detecting pressure as well as the touch location.

The Piezoelectric Layer

The piezoelectric layer 50 has a thickness $TH_{50}$, which in an example is in the range defined by 50 nm≤$TH_{50}$≤5000 nm. The piezoelectric layer 50 of PE film structure 10 can be made of one or more of a number of different types of piezoelectric materials. Example piezoelectric materials include CdS, CdSe, ZnS, ZnTe, ZnO, AlN, barium titanate ($BaTiO_3$), a lead-free niobate, such as $Na_{0.5}K_{0.5}NbO_3$, lead-zirconate-titanate (PZT), lead-lanthanum-zirconate-titanate (PLZT), and a lead-free titanate, such as $Na_{0.5}Bi_{0.5}TiO_3$ and $K_{0.5}Bi_{0.5}TiO_3$. Example piezoelectric materials for piezoelectric layer 50 also include polymeric piezoelectric materials including PVDF, polyimide, and parylene based materials as well as 'piezocomposites' such as those incorporating lead magnesium niobate-lead titanate (PMN-PT) particles in a polymeric matrix. Additional examples of piezoelectric materials and composites can be found in the article by Ramadan et al., "A review of piezoelectric polymers as functional materials for electromechanical transducers," Smart Mater. Struct. Vol. 23, No. 3 (2014), which article is incorporated herein by reference.

The materials AlN and ZnO can be used for piezoelectric layer 50 in situations where ease of deposition is a consideration, as these materials are particularly amenable to thin-film deposition using known techniques. The material AlN has a relatively high hardness, and oxygen-doped AlN has a desirable combination of relatively high hardness and relatively low optical absorption as compared to other piezoelectric materials. The AlN, oxygen-doped AlN, or AlON films used for piezoelectric layer 50 can have a crystalline wurtzite structure. It is known that that oxygen-doped AlN containing up to about 20 atomic % oxygen can still exhibit a substantial piezoelectric effect.

The inventors have performed experiments with oxygen doping of AlN and have found that oxygen doping can be used effectively to increase the optical transmission or lower the optical absorption of an AlN layer. However, too much oxygen doping can disrupt the piezoelectric quality of the AlN films. Thus, it may be desirable to limit the oxygen content in the doped AlN films in one example to less than about 40%, in another example to less than about 20%, in another example to less than about 10%, or in another example less than about 5%, or in other examples to target an oxygen concentration to be in the range of about 0.1 to 20% or 0.1 to 10%, wherein all values in atomic %.

In an example, piezoelectric layer 50 can include non-centrosymmetric crystals, a single-crystal layer, a polycrystalline structure, or a crystalline material having its c-axis oriented approximately normal to the plane defined by substrate surface 22.

In another example, piezoelectric layer 50 can include one or more ferroelectric materials, where an external field is applied during processing to align the microstructure. In other examples, one or more non-ferroelectric materials can be used, with substantial grain alignment being accomplished during a thin-film deposition process.

In an example, piezoelectric layer 50 is substantially crystalline or polycrystalline, with a c-axis crystal orientation approximately normal or orthogonal to the plane of substrate surface 22, i.e., substantially aligned with the z-axis. When polycrystalline, a majority of crystallites (greater than 50%, 60%, 70%, 80%, or 90% of crystallites) have a c-axis orientation that is approximately normal to the substrate surface plane, which can be measured using x-ray diffraction. The material may exhibit a corresponding significant or dominant x-ray diffraction peak near a diffraction angle of 2θ=36 degrees, indicating good c-axis orientation nearly orthogonal to the substrate surface 22, meaning that the (0002) crystal planes lie nearly parallel to the substrate surface). In some cases, the crystalline piezoelectric material can exhibit a high quality of crystalline orientation uniformity as indicated by an x-ray rocking curve width (FWHM of AlN (0002) peak) of less than about 20 degrees, less than about 10 degrees, less than about 5 degrees, less than about 3 degrees, or less than about 2 degrees.

The piezoelectric layer 50 can have a piezoelectric coefficient d (or $d_{ij}$ along any axis, or $d_{33}$ along a particular axis) greater than 0.1, greater than 1, greater than 2, greater than 4, or greater than 5 pm/V, or in the range of 0.1 to 15 pm/V (in units of picometers per volt). The units for the piezoelectric coefficient d may also be expressed as picocoulombs/newton, making the above range equivalent to 0.1 to 15 pC/N.

The piezoelectric voltage coefficient g (or $g_{ij}$ along any axis, or $g_{33}$ along a particular axis) of the material in piezoelectric layer 50 may be greater than about 1, greater than 10, greater than 20, greater than 40, greater than 50, or in the range of 1-150 mV-m/N (millivolt-meters per Newton). The piezoelectric layer 50 may have a relative permittivity $\varepsilon/\varepsilon_0$ greater than 1, greater than 5, or greater than 10. The refractive index of the piezoelectric layer 50 and/or the transparent electrode layers may lie in the range from about 1.7 to about 2.3. In addition, the piezoelectric layer 50 may exhibit a low film stress that has an absolute value (whether tensile or compressive) less than about 1000 MPa, less than 500 MPa, or less than 200 MPa.

In an example, the crystalline structure of piezoelectric layer 50 can be approximately classified as belonging to class 32, or to class 43m. In more specific examples, the crystalline structure of the piezoelectric layer 50 can be represented by quartz crystal or ZnS crystal with the zincblende structure. In an example embodiment, the c-crystal axis may be non-orthogonal to the class surface. In a related example, the bottom and top conducting electrodes 40B and 40T may be disposed in elongated trenches etched inside the piezoelectric layer 50 rather than on the two large bottom and top surfaces of the piezoelectric layer.

In an example, a crystalline piezoelectric layer 50 may be obtained by: i) ion-implantation of a crystalline wafer of the desired piezoelectric material; ii) then bonding the ion-implanted surface to a glass substrate to be used as a touch-sensitive glass cover; iii) and then separating a layer of the crystalline wafer on the ion-implanted side from the rest of the crystalline wafer. Etching of the trenches and disposal of the conducting electrodes may be completed prior to or after the attachment of the piezoelectric layer 50 to the glass substrate and its separation from the crystalline wafer.

In another embodiment, the piezoelectric layer 50 exhibits both a piezoelectric effect and a pyroelectric effect. In some embodiments, the pyroelectrically produced electric signal is not used for pressure sensing. Instead, the component of the signal due to the piezoelectric effect is substantially isolated (separated) from the component of the signal due to the pyroelectric effect. In an example, this signal separation is accomplished using a combination of mechanical and thermal means, and/or electronic and software techniques (e.g., filtering) in the temporal and/or frequency domain, as discussed below.

The different layers that make up PE film structure 10 can be formed using thin-film techniques known in the art, e.g., sputtering, reactive sputtering, e-beam evaporation, CVD, PECVD, or PLD. Other vapor deposition methods such as may also be utilized in some cases.

In various examples, the piezoelectric layer 50 is discretized or "pixelated" to form electrically isolated regions, or can be formed as a grid. In an example, spaces or gaps in different regions of piezoelectric layer 50 can be filled with a dielectric material or like material having low conductivity or low piezoelectric function. In an example, the dielectric material has a similar refractive index to the piezoelectric material of piezoelectric layer 50, thus rendering the patterning largely invisible.

The Piezoelectric Sensor System

Figure 3:
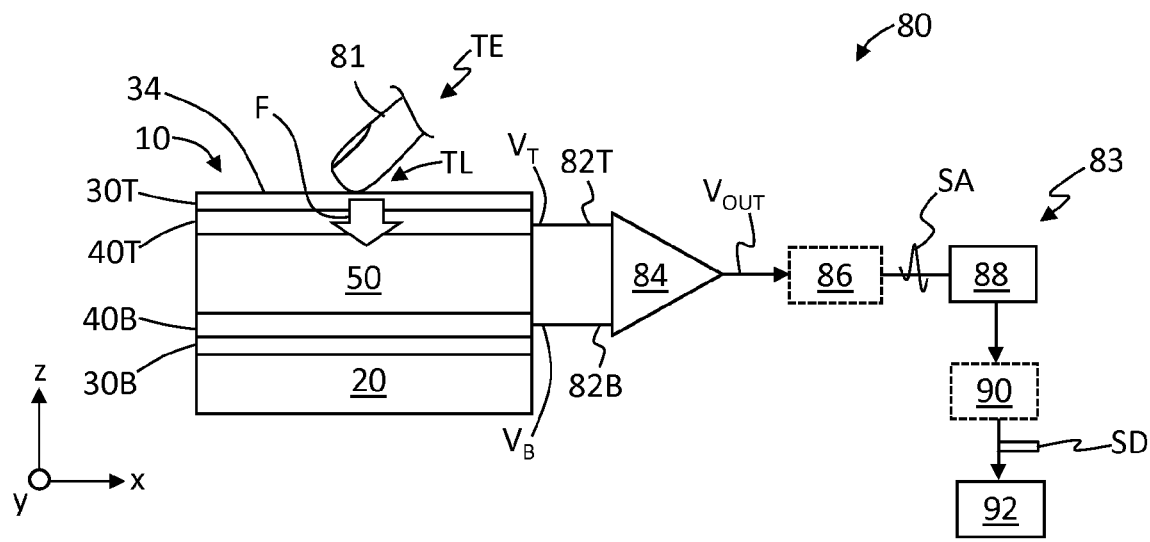
FIG. 3 is a schematic diagram of an example piezoelectric sensor system that employs the example piezoelectric film structure of FIGS. 1 and 2.

FIG. 3 is a schematic diagram of an example piezoelectric (PE) sensor system 80 that employs the example PE film structure 10 of FIGS. 1 and 2, which in an example can be one of the example PE touch-sensing (PETS) film structures 10S described below. The PE sensor system 80 is configured to generate a signal (voltage or current) via the piezoelectric effect in piezoelectric layer 50 when a force F is applied to PE film structure 10. FIG. 3 shows the force F being applied by a finger 81, wherein the force F gives rise to a mechanical stress in piezoelectric layer 50 that elicits the signal via the piezoelectric effect. The application of finger 81 to the upper surface (touch surface) 34 of PE film structure 10 is referred to herein as a "touch event" TE, and the (x,y) position of the touch event is referred to as a "touch location" TL.

The PE sensor system 80 includes electrical connections 82B and 82T respectively connected to the bottom and top conductive layers 40B and 40T, which serve as bottom and top electrodes. The electrical connections 82B and 82T can comprise, for the example, the aforementioned thin metal lines, wires or traces.

Electrical connections 82B and 82T are also electrically connected to a signal-processing system 83, which is configured to process electrical signals outputted by PE film structure 10. In an example, signal processing system 83 includes an analog circuit 84. In an example, analog circuit 84 includes a differential amplifier, an integrator or differentiator. The analog circuit 84 can be used to provide amplification of the signal from PE film structure 10 when the signal (output voltage or output current) from the PE film structure is low. It can also be used to integrate a current signal when the total charge is used as the measure of stress applied to PE film structure 10. It can alternatively differentiate the signal when the derivative of the current is used as a measure of the peak impulse stress.

FIG. 3 shows bottom and top voltages $V_B$ and $V_T$ generated at the bottom and top transparent conductive layers 40B and 40T, and shows analog circuit 84 generating an output voltage $V_{OUT}$ as an example analog output signal SA. The analog output signal SA can also be a current signal, e.g., $i_{OUT}$.

The signal processing system 83 of PE sensor system 80 can optionally include one or more analog filters 86 that can alternatively perform an equivalent task to the aforementioned signal differentiation, by isolating the initial slope of the output signal through high-pass filtering. The differentiation and/or high-pass filtering can be used to extract the piezoelectric signal while substantially rejecting an attendant pyroelectric signal when the latter is unwanted. In addition, band/pass or low-pass filtering performed by analog filters 86 can be used to eliminate high-frequency noise in analog output signal SA.

The signal processing system 83 of PE sensor system 80 also includes an analog-to-digital converter (ADC) that receives the analog output signal SA and converts it to a digital output signal SD. The signal processing system 83 further optionally includes a digital filter 90 electrically connected to ADC 88 and that serve the analogous filtering function for digital signal SD as the analog filters 86 serve for the analog output signal SA. Thus, in an example, only one type of filter 86 (analog) or 90 (digital) is employed.

The signal processing system 83 of PE sensor system 80 also includes a central processing unit (CPU) 92 electrically connected to the ADC 88 (e.g., through the optional digital filter 90). The CPU 92 can include instructions embodiment in a non-transient computer-readable (e.g., logic, software, firmware, etc.) that can process the received digital output signal SD, e.g., to determine whether it conforms to one or more signal requirements.

In an example, CPU 92 determines at least one touch-sensing feature for each of one or more touch events TE, such as: the position of the touch location TL, an amount of pressure applied at the touch location, an amount of force applied at the touch location, the duration of the touch event, a size of the touch location, a shape of the touch location (e.g., such as formed by swiping distance or shape), an acceleration, and an acoustic sensing, such as for a voice command.

In some embodiments, the PE sensor system 80 can also be used to harvest vibrational energy to provide useful energy to other components of the system, or to generate energy that can be stored in a battery (not shown). In such energy harvesting embodiments of PE sensor system 80, the signal processing system 83 may not require as much signal processing or computing capability.

As described above, in an example of PE sensor system 80, a combination of pyroelectric and piezoelectric effects occur in piezoelectric layer 50 and produce the analog output signal (voltage or current) SA from PE film structure 10. The output signal SA is then processed to deduce one or more features associated with the touch event TE. In an example wherein the piezoelectric layer 50 is formed from a sputtered AlN film, the electrical output (voltage or current) due to the pyroelectric effect may be comparable or larger than the piezoelectric effect.

In another example of PE sensor 80, the pyroelectric effect is substantially reduced or excluded from contributing to analog output signal SA. This is done by ensuring that the symmetry properties of the crystalline structure of piezoelectric layer 50 suppress or prevents the pyroelectric effect, while supporting the piezoelectric effect.

The inventors have recognized that the piezoelectric contribution to (component of) the analog output signal SA from PE layer 50 can be enhanced relative to the pyroelectric contribution to (component of) the analog output signal if the analog output signal is collected during a period of approximately 40 ms, 60 ms, 80 ms, 100 ms, or 120 ms immediately following the earliest sensing of the touch event TE.

In addition, it has been found that increasing the thickness $TH_S$ of substrate 20 enhances the piezoelectric signal contribution (component) of the analog output signal SA and reduces the pyroelectric signal contribution (component) during the signal collection period when the collection period is selected to be on the order of 120 ms or less.

In an example, the thickness $TH_S$ of substrate 20 is preferably greater than or equal to 0.4, 0.5, 0.6, 0.7 mm, and especially greater or equal to 0.8, 0.9, and 1.0 mm. The corneal layer of the epidermis of the contacting finger 81 typically has thermal conductivity that is a few times smaller than that of glass, and thickness on the order of 0.5 mm. Increasing the substrate thickness $TH_S$ beyond 0.5 mm, and selecting a material for substrate 20 having higher thermal conductivity, particularly higher than 1 W/m•K, and especially higher than 1.2 W/m•K, can be used to improve the isolation (separation) of the piezoelectric signal component.

In addition, frequency-domain filtering of the analog output signal SA from PE sensor 80 is used to further isolate the piezoelectric signal component from the pyroelectric signal component, and also to improve the signal-to-noise ratio. In particular, signal processing system 83 can be configured to perform high-pass filtering with a cut-off frequency $f_1$ between about 7 Hz and about 30 Hz, or between about 8 Hz and 25 Hz, or between about 10 Hz and 20 Hz. In addition, signal processing system 83 can be configured to perform low-pass filtering to de-noise the analog or digital output signal SA or SD, with a cut-off frequency $f_2$ between about 10 Hz and about 10 kHz, or between about 15 Hz and 5 kHz, or between about 20 Hz and 1 kHz.

In another embodiment, an electrical signal (pulse) from the piezoelectric and pyroelectric effects is produced to form the analog output signal SA, and signal processing system 82 is configure to analyze the derivative of this output signal. In particular, the derivative at the very beginning of the pulse has a lower fractional contribution from the pyroelectric effect than later in the pulse. Hence, the signal used to evaluate a feature or a functionality associated with the touch event TE at the touch location TL may be selected to be proportional to the derivative of the portion of electrical analog output signal collected at the beginning of the pulse, or the average derivative from the initial 1 ms, 2 ms, 5 ms, 10 ms, or 20 ms of the pulse.

In an example, signal processing system 83 can be configured to digitize the entire pulse waveform of analog output signal SA to for digital output signal SD, which is then temporarily stored and analyzed. Alternatively, the signal processing system 83 may be configured to extract the derivative of the analog output signal SA by methods known in the art, which may involve delaying the pulse, creating an amplified version of the pulse, and triggering when a voltage, charge, or current becomes higher than a certain positive value or lower than a certain negative value. The triggering is used to indicate that a pulse has arrived whose front edge needs to be found and measured.

The above-described embodiments for processing the analog output signal SA to reduce or mitigate the effects of the pyroelectric effect can work particularly well in combination with a crystalline substrate 20 having substantial thermal conductivity. Such a substrate 20 acts to delay the pyroelectric response peak slightly in the very beginning by preventing a rapid temperature rise of piezoelectric layer 50 by quick heat transfer through the body of the substrate. This slight delay works for a few ms up to a few tens of ms, until the temperature throughout the body of substrate 20 starts to change noticeably in the contacted area.

Figure 4:
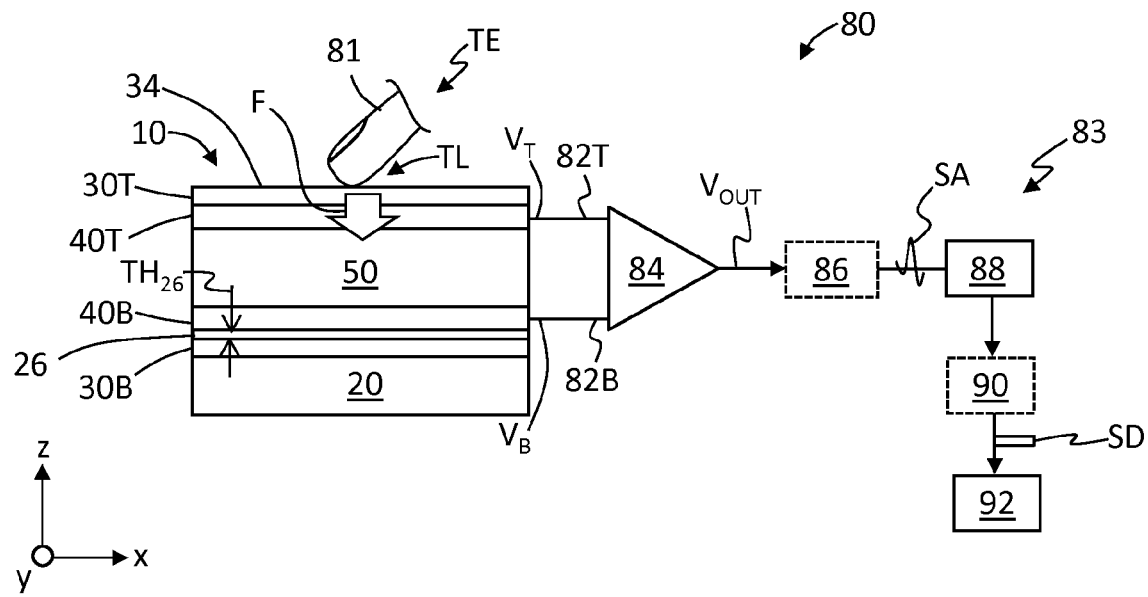
FIG. 4 is similar to FIG. 3 and illustrates an example piezoelectric sensor system that includes a crystalline layer between the piezoelectric layer and the bottom optical layer.

FIG. 4 is similar to FIG. 3 and illustrates an embodiment of PE sensor 80 that includes a crystalline layer 26 of thickness $TH_{26}$ disposed between the piezoelectric layer 50 and substrate 20. In an example, the thickness $TH_{26}$ of crystalline layer 26 has a small or intermediate value, e.g., ranging from about $TH_{26}=20$ μm to about 300 μm, while further in an example, substrate 20 has a thickness $TH_S>0.3$ mm. The large thermal conductivity of the crystal layer 26 is used to delay the temperature rise of the piezoelectric layer 50 by a few milliseconds, so that the main portion of the derivative of the front edge of the analog output signal SA is due to the piezoelectric effect. The use of a crystal-glass hybrid for crystalline layer 26 can help reduce the cost of this embodiment relative to using a crystal-only material.

As noted above, embodiments of PE sensor 80 utilize a measurement of the derivative at the leading portion of the analog output signal SA. In this case, the final analog or digital output signal SA or SD may be corrected for contribution of the pyroelectric effect in the initial signal derivative by subtracting or adding to the initial derivative a portion proportional to the charge integrated during a later portion of the pulse. This can be done either in the analog domain on analog output signal SA, or after digitizing the pulse to form the digital output signal SD.

Addition or subtraction of the correcting portion can be performed based on whether the contribution of the pyroelectric signal to the initial derivative of the pulse is of the same sign as the contribution from the piezoelectric effect. This in turn depends on the relative sign of the appropriate pyroelectric coefficient to the effective piezoelectric coefficient for the particular device geometry, and on whether the temperature of the touching device (such as the human finger skin temperature) is higher or lower than the temperature of the piezoelectric layer 50 at the moment just before the touch event TE.

Example PE Film Structures

Aspects of the disclosure include example PE film structures based on the above-described PE film structure 10 but that include additional layers and/or features that add one or more touch-sensing functionalities that enable determination of one or more touch-sensing features at one or more touch locations TL when used in a PE sensor 80. These PE film structures are referred to hereinbelow as PE touch-sensing (PETS) film structures 10S.

Figure 5:
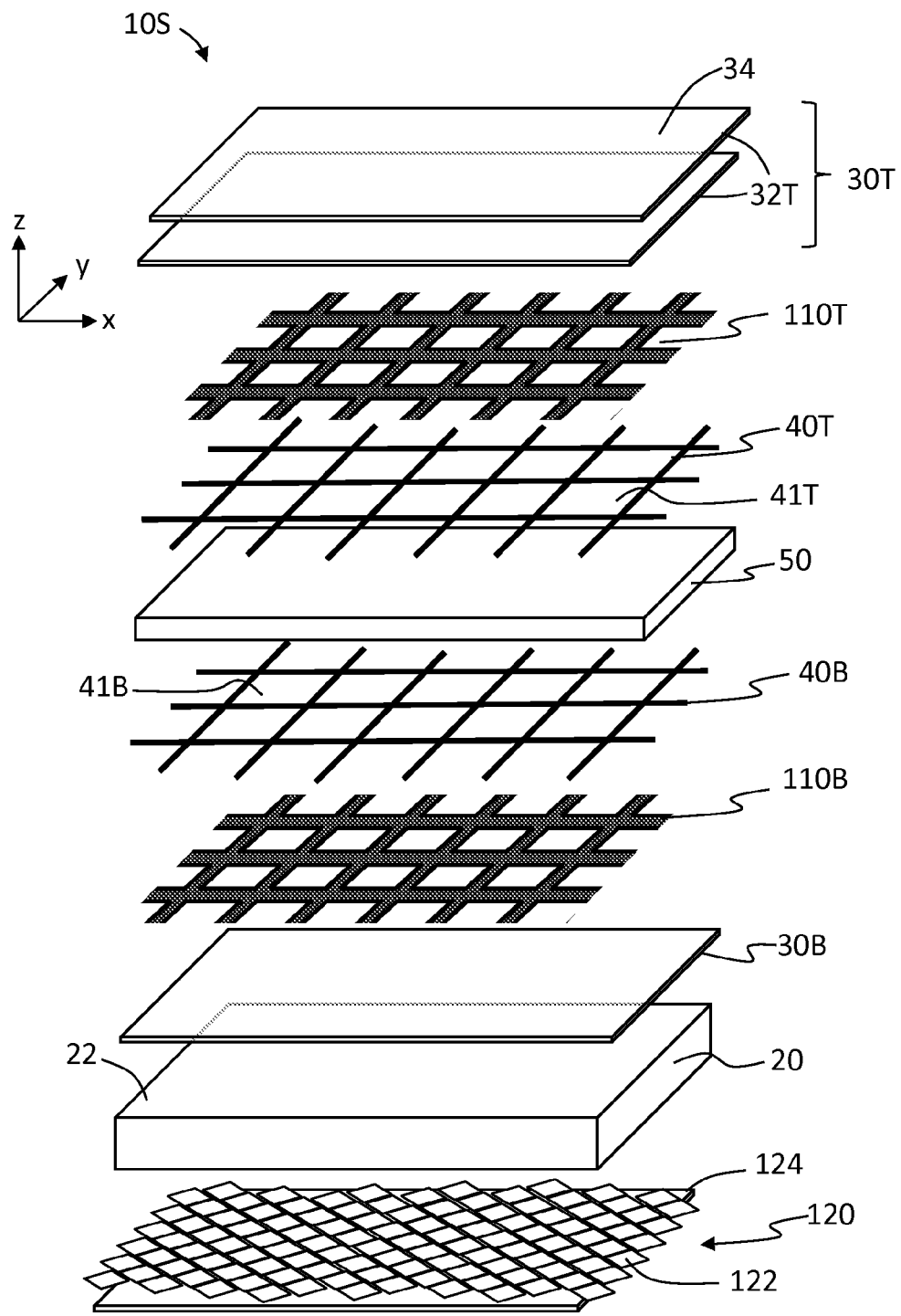
FIGS. 5 through 11 are front-elevated, exploded views of example piezoelectric touch-sensing (PETS) film structures.

FIG. 5 is a front-elevated, exploded view of a first example of a PETS film structure 10S. The PETS film structure 10S includes the layers of the PE film structure 10, namely substrate 20, bottom and top optical layers 30B and 30T, and bottom and top conductor layers 40B and 40T. The bottom and top conductor layers 40B and 40T are now patterned (e.g., in an x-y grid) to define respective top and bottom patterned electrodes. In an example, the uppermost layer 32T of optical layer 30T serves as a user-interface layer. In one or more embodiments, the optical layer 30T defines upper surface 34 and can comprise materials or structures having a high hardness, a high abrasion resistance, and/or a high scratch resistance.

The PETS film structure 10S also includes bottom and top transparent electromagnetic (EM) shielding layers 110B and 110T that respectively reside below bottom conductor layer 40B and above top conductor layer 40T. Example materials for the EM shielding layers 110B and 110T include TCO, metal, carbon nanotubes, graphene, etc. The EM shielding layers 110B and 110T may comprise both a conducting material used for shielding as well as an insulating material or layer used to isolate the conductor in the EM shield from the conductor in the patterned electrodes. Example materials for the insulating layer may include $SiO_2$, $SiN_x$, and other dielectric materials known in the display and touch sensor arts. The bottom and top EM shielding layers 110B and 110T are optional features and are used to reduce noise.

Figure 6:
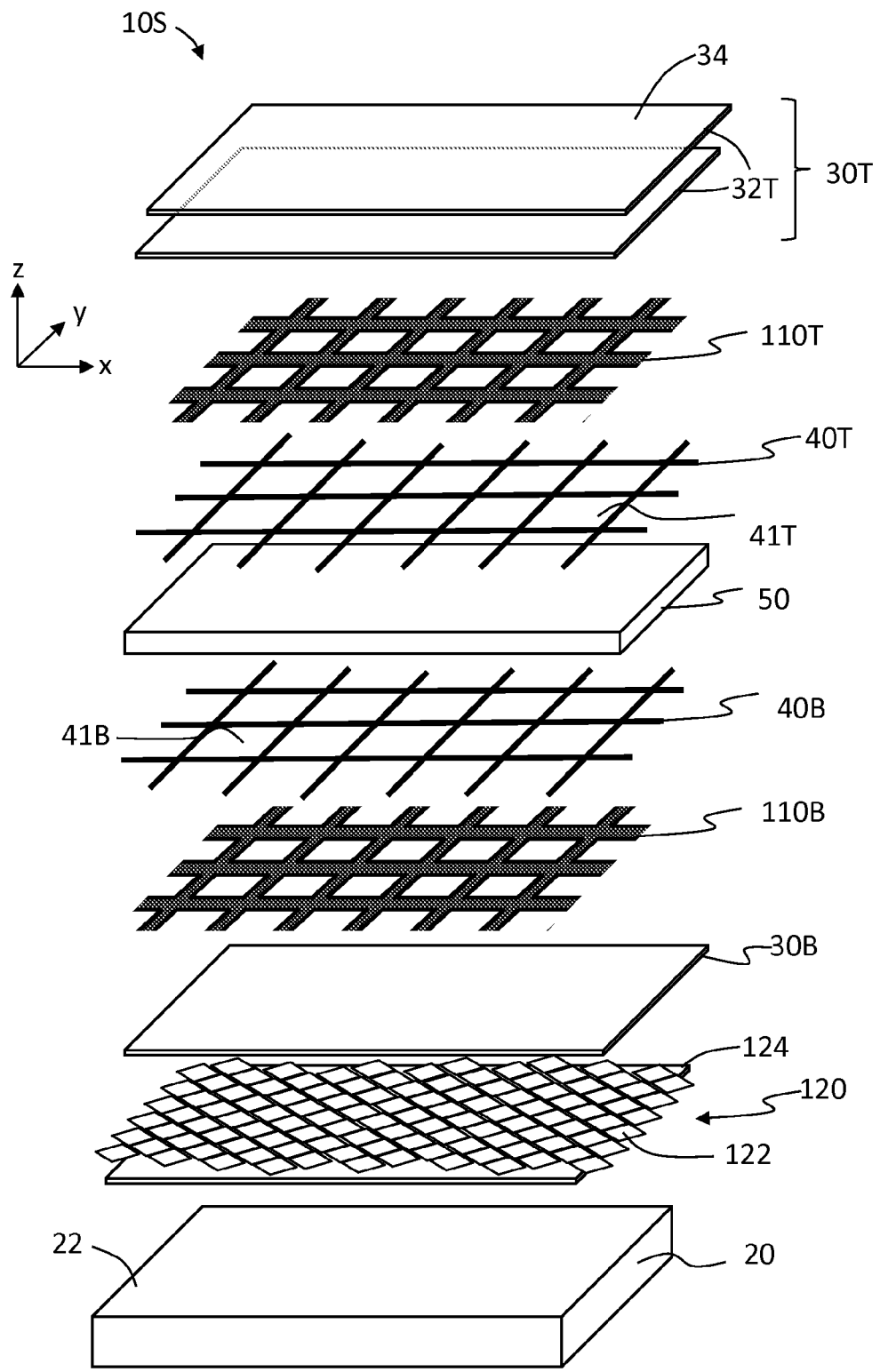

The PETS film structure 10S also includes at least one projected-capacitive touch-sensor layer ("P-CAP layer") 120, which is shown by way of example as residing immediately beneath substrate 20. In an example, the P-CAP layer 120 includes patterned TCO 122 on an insulating film layer 124, where the TCO pattern has a larger or misaligned coverage area relative to the bottom and top patterned conductor layers 40B and 40T and/or EM shielding layers 110B and 110T to avoid complete shielding of the P-CAP layer from the conductor or EM shielding layers. The P-CAP layer 120 can be single-sided or double-sided. The P-CAP layer 120 can also reside above substrate 20, e.g., atop substrate upper surface 22, as shown in FIG. 6. Multiple P-CAP layers 120 can also be employed.

In an example, substrate 20 can be in the form of or can be replaced by an insulating film layer, which can be a hard layer or an optical layer. There can also be additional optical layers above and/or below the one or more P-CAP layers 120.

The bottom and top conductive layers 40B and 40T serve as electrodes and are used to extract the analog output signal SA produced by the piezoelectric effect that occurs in PE layer 50. In an example, the grid structure of the bottom and top conductive layers 40B and 40T respectively define openings 41B and 41T. In various examples, openings 41B and 41T comprise more than 30% of the layer area, preferably more than 50% of the total layer area, and ideally more than 70% of the total layer area. In addition, the average size of the openings 41B and 41T is preferably greater than about 30% of the thickness $TH_S$ of substrate 20, while in another example are on the order of the substrate thickness $TH_E$, while in another example are substantially larger that the substrate thickness $TH_S$. These embodiments are particularly useful when the P-CAP layer 120 is disposed beneath substrate 20, as is shown in FIG. 5.

Figure 7:
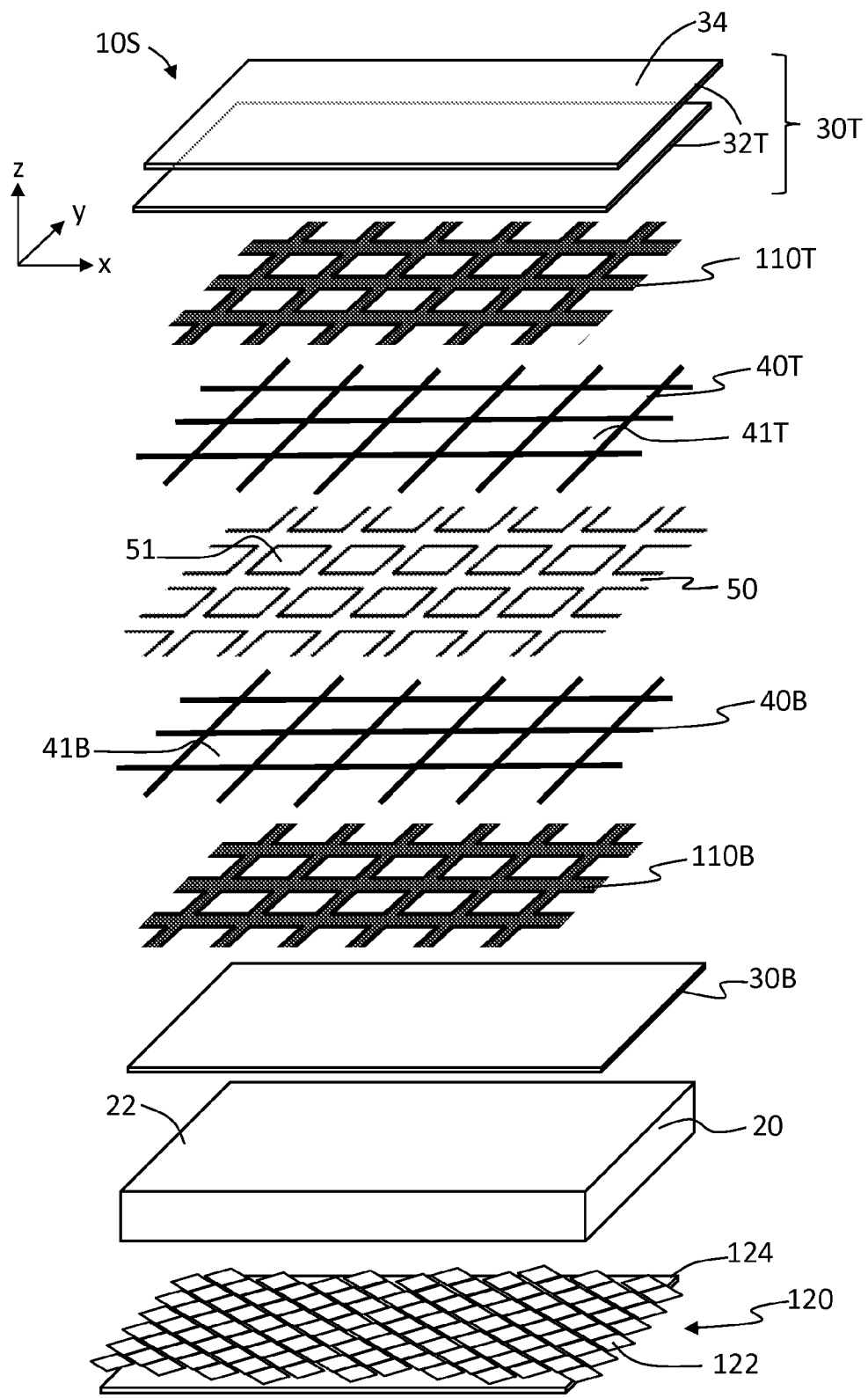

FIG. 7 is similar to FIG. 5 and shows an example PETS structure 10S wherein the piezoelectric layer 50 is patterned (e.g., as an x-y grid) with spaces 51. This allows for selective activation of the piezoelectric layer 50 based on the location of the touch event TE and provides touch-location functionality.

Figure 8:
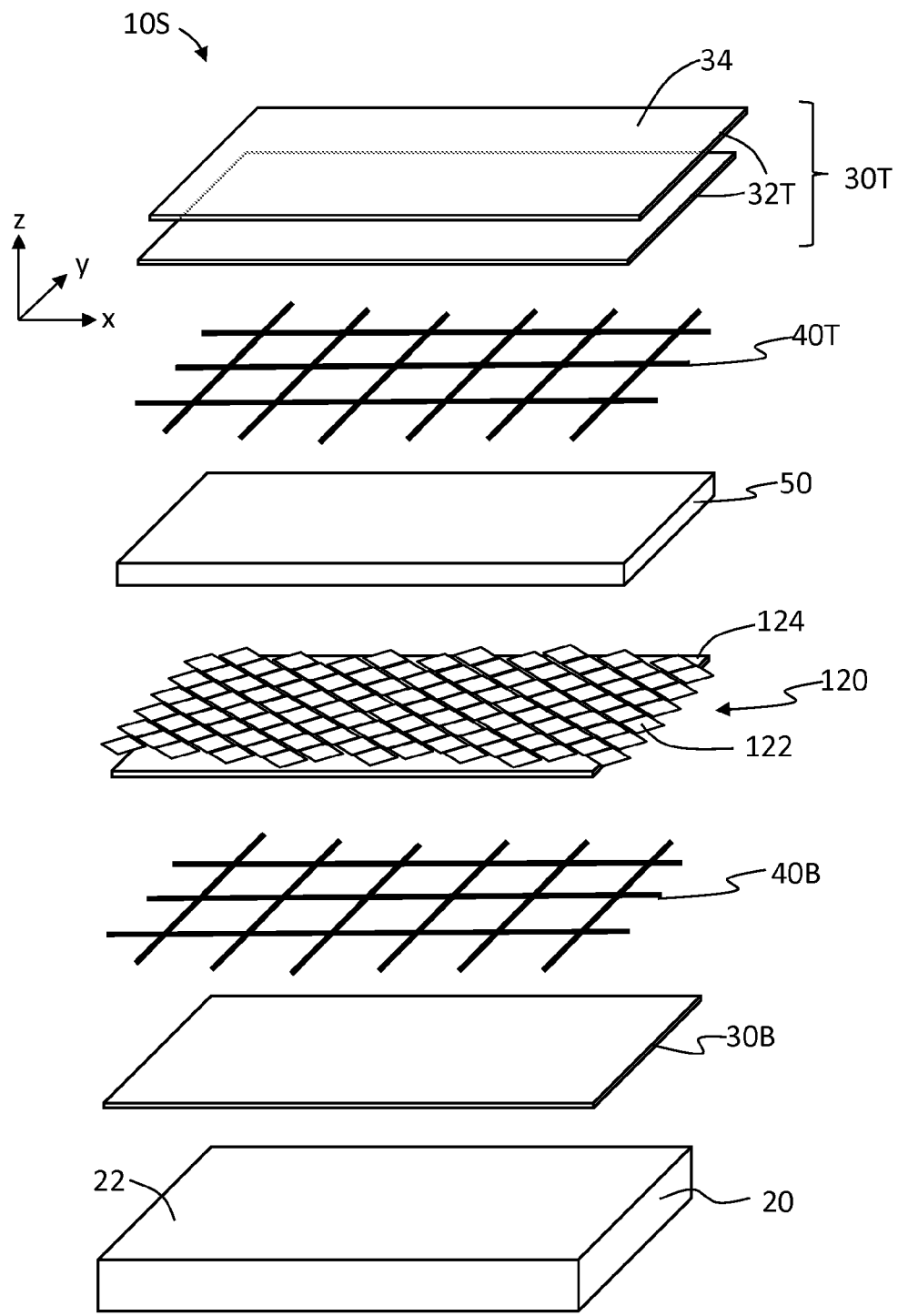

FIG. 8 is similar to FIG. 5 and shows an example PETS structure 10S wherein the P-CAP layer 120 is disposed between the piezoelectric layer 50 and bottom conductor layer 40B. This configuration enables both capacitive touch sensing to define the location of a touch event TE and piezoelectric touch sensing to provide one or more touch-sensing features, with pressure sensing being one example feature. In an example, the electrodes of the P-CAP layer 120 can also serve as the bottom electrodes defined by bottom conducting layer 40B. In another example, the bottom electrodes 40B are separate from the P-CAP layer, though they can also be interleaved with the P-CAP layer.

Figure 9:
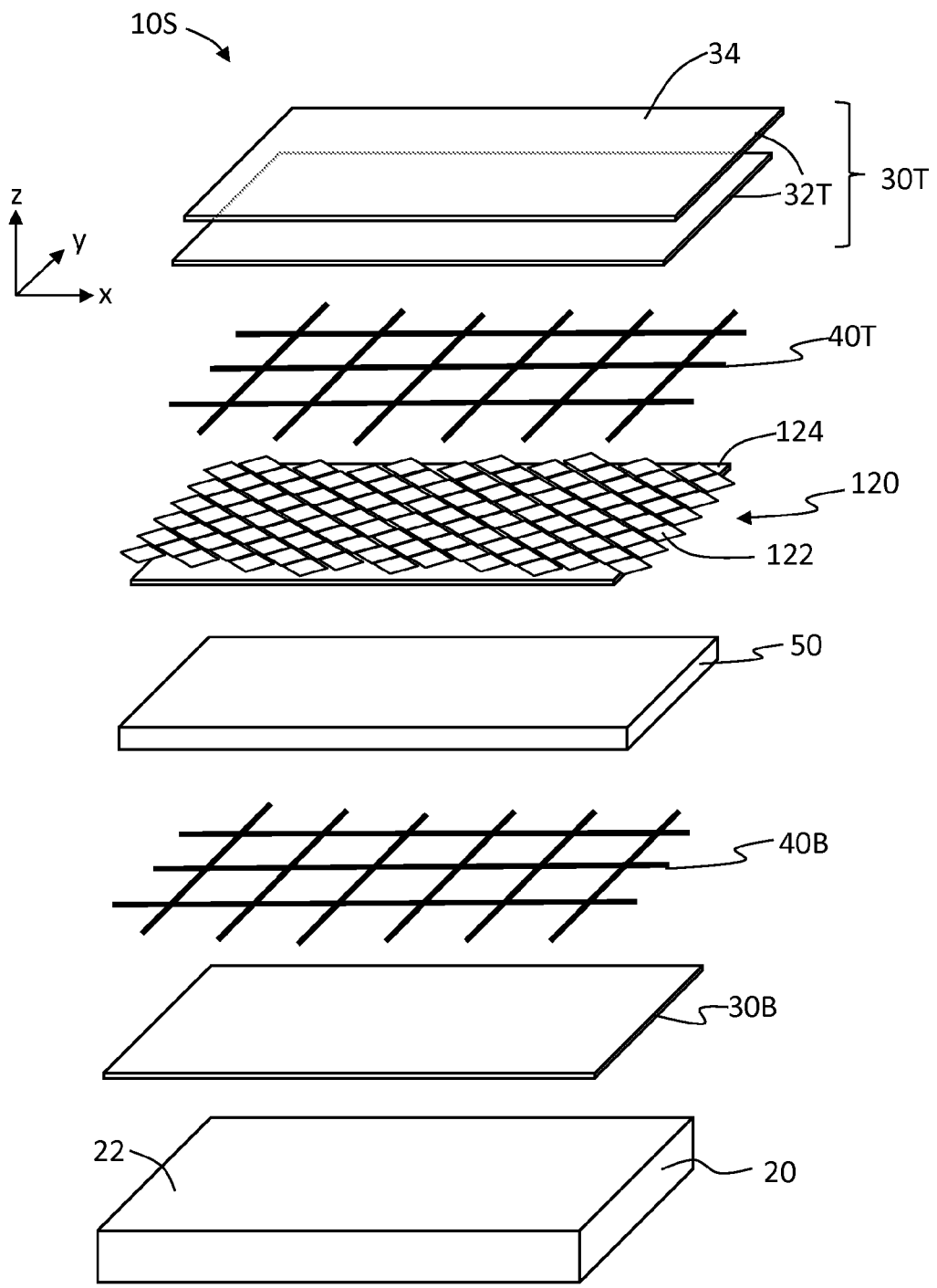

FIG. 9 is similar to FIG. 8 and shows an example PETS structure 10S wherein the P-CAP layer 120 is disposed between the piezoelectric layer 50 and the top conducting layer 40T. In configurations of the PETS structure 10S such as shown in FIG. 8 and FIG. 9, insulating layers (not shown in drawings) may be added as needed between adjacent conducting layers, such as between adjacent conducting layers in the P-CAP layer 120 or between the P-CAP layer and the bottom and top conducting layers 40B or 401. Such insulating layers and methods are known to those skilled in the art of touch sensor design.

Figure 10:
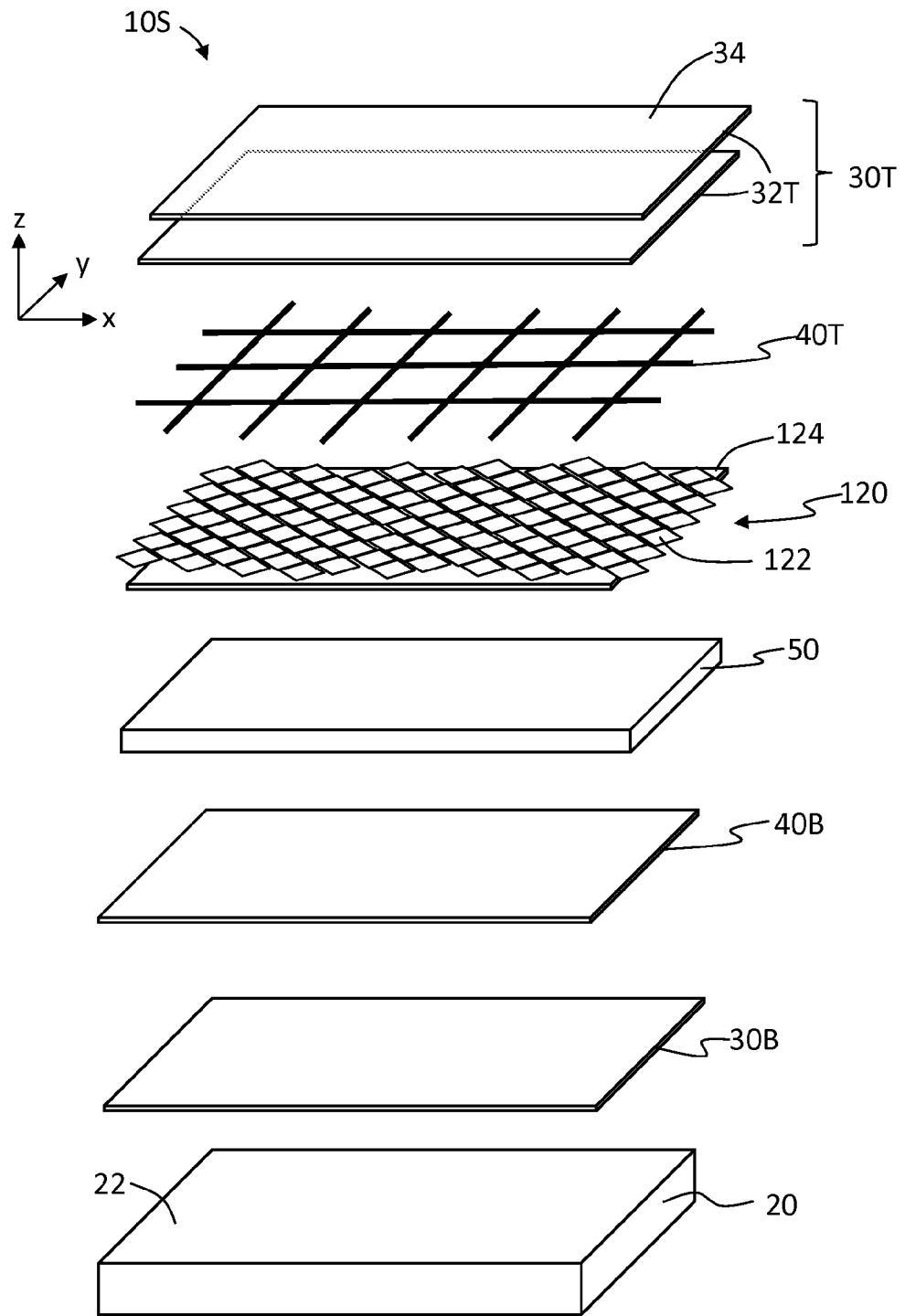

FIG. 10 is similar to FIG. 9 and illustrates an example PETS structure 10S wherein only one of the bottom and top conductor layers 40B and 40T is patterned (the top conductor layer 40T is shown patterned by way of illustration). In this case, the P-CAP touch layer 120 is placed above the non-patterned (or "continuous") bottom conducting layer 40B (which serves as a continuous electrode) to avoid shielding between the user input surface 34 and the P-CAP layer 120 by the bottom conducting layer 40B.

Figure 11:
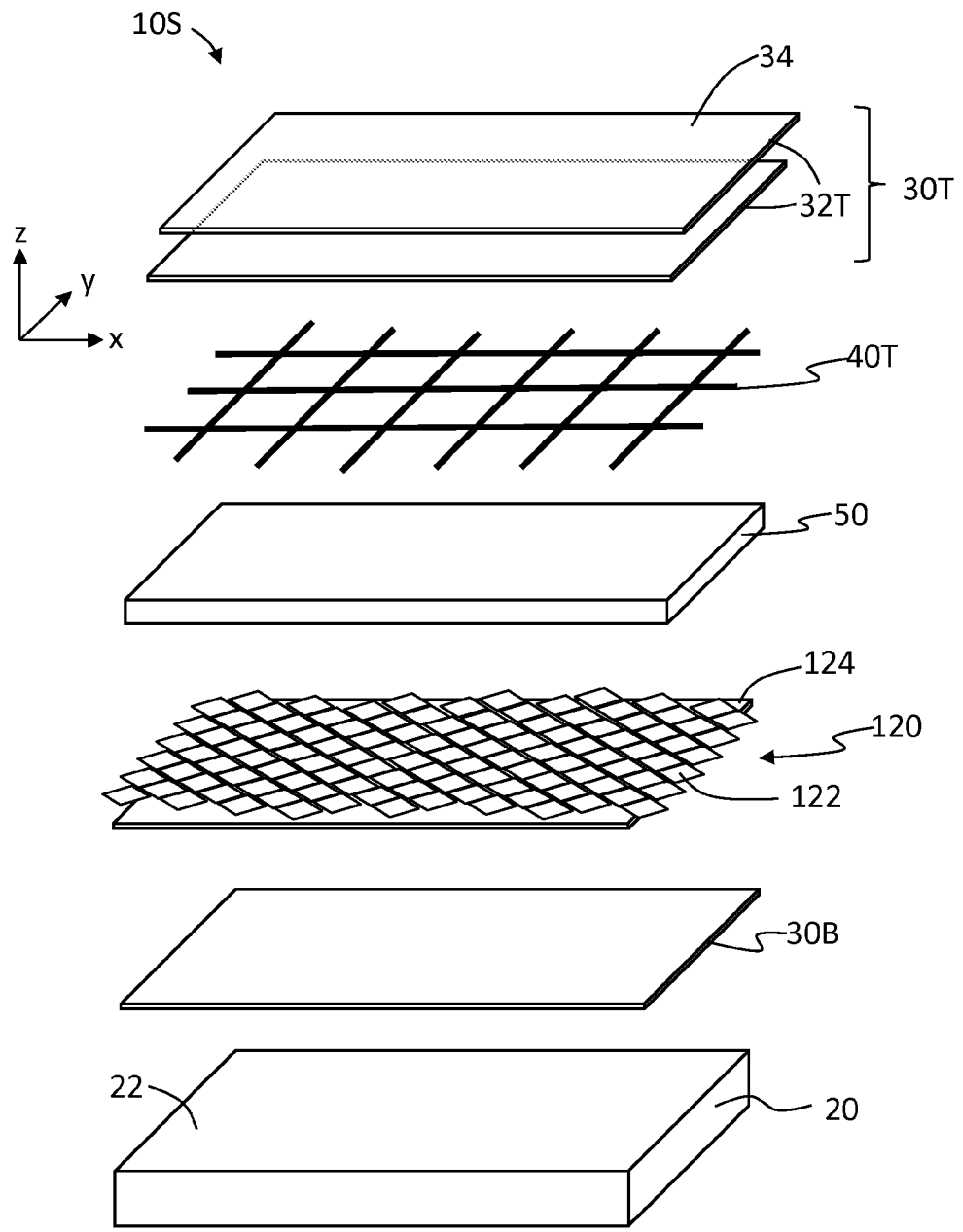

FIG. 11 is similar to FIG. 10 and illustrates an alternate embodiment wherein the bottom conducting layer 40B can be removed and a conducting portion 122 of the P-CAP layer 120 can be used as the bottom electrode for electrical sensing of voltage or current generated in the P-CAP layer, working together with the piezoelectric layer 50 and top conductor layer 40T.

Figure 12:
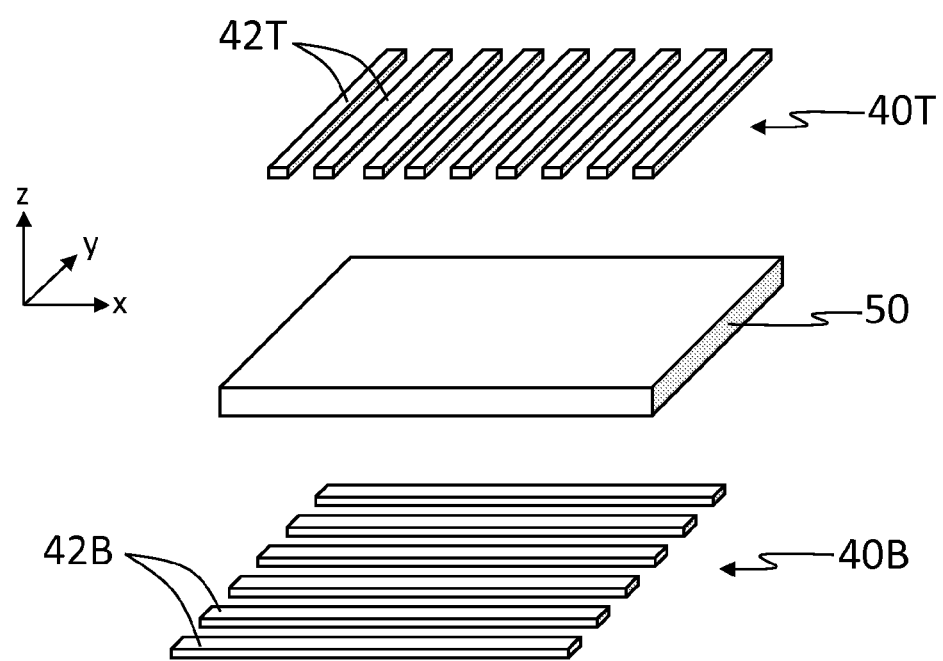
FIG. 12 is an elevated, exploded view of an example configuration of the bottom and top conducting layers relative to piezoelectric layer, wherein the top and bottom conductor layers are formed as strips that respectively define columns and rows.

FIG. 12 is an elevated, exploded view of an example configuration of the bottom and top conducting layers 40B and 40T on opposite sides of the piezoelectric layer 50. In the example configuration, top and bottom conducting layers 40B and 40T are each formed in strips, with the strips of the top conducting layer running in the y-direction and forming "columns" 42T and the strips of the bottom conducting layer running in the x-direction and forming "rows" 42B. Each one of the strips 42B and 42T may constitute a continuous or contiguous layer of transparent conductor, or may consist in a sparse grid. This configuration resembles that used for capacitive touch-sensing devices and enables the touch location TL to be determined by processing the signals from the rows 42B and columns 42T.

In an example, one of the conductive layers 40B or 40T is held to ground and a first set of analog output signals SA from the other conductive layer are measured. Then the other conductive layer is held to ground and a second set of analog output signals SA from the ungrounded transparent conductive layer is measured. The first and second sets of analog output signals SA are then processed by CPU 92 (see FIG. 3) to extract the touch location TL to within the resolution of column-and-row structure, which is defined in part by the width and spacing of the conductive strips 42B and 42T.

Figure 13A:
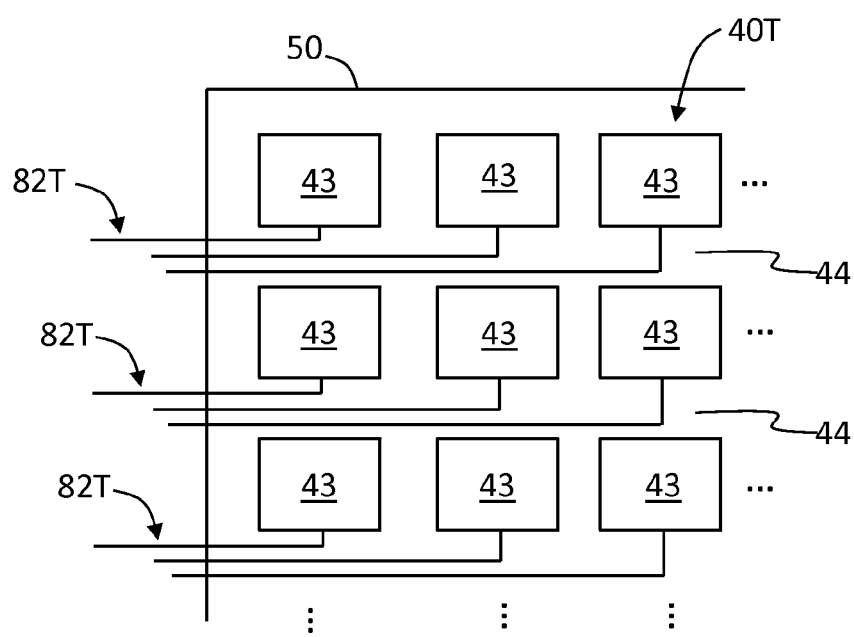
FIG. 13A is a top-down view of an example top conductor layer formed atop a piezoelectric layer, wherein the top conductor layer is defined by a plurality of electrically isolated conductive regions that are individually addressable via wiring routed through the gaps between the regions.

FIG. 13A is a top-down view of an example top conductor layer 40T formed atop piezoelectric layer 50. The top conductor layer 401 is defined by a plurality of electrically isolated conductive regions 43. Adjacent isolated regions 43 are separated by gaps 44 and are individually addressability via wiring (i.e., conductive lines) 82T routed through the gaps to signal processing system 82 (not shown; see FIG. 3). The segmented configuration of the top conductor layer 40T allows for localized detection of touch locations TL associated with touch events TE. The configuration of FIG. 13A reduces the "loading" effect caused by regions of the piezoelectric layer 50 that do not directly experience any pressure but that contribute to the analog output signal SA. Reducing the loading effect increases the strength of the analog output signal SA.

Figure 13B:
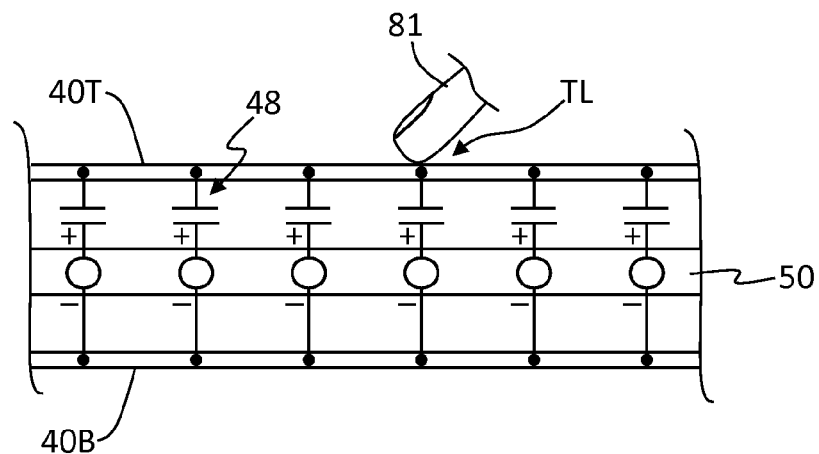
FIG. 13B is a schematic cross-sectional view of a piezoelectric layer sandwiched by continuous bottom and top conductor layers, and showing the activation of equivalent circuits formed by the structure.

To illustrate the above point, FIG. 13B is a schematic cross-sectional view of an example structure having a piezoelectric layer 50 with continuous bottom and top conductor layers 40B and 40T (which could also be continuous, non-isolated conducting lines) sandwiching the piezoelectric layer. FIG. 13B also shows equivalent circuits 48 formed by the structure. When pressure is applied by finger 81 at touch location TL, all of the equivalent circuits 48 are activated to varying degrees and contribute to loading the overall analog output signal SA (see FIG. 3).

Figure 13C:
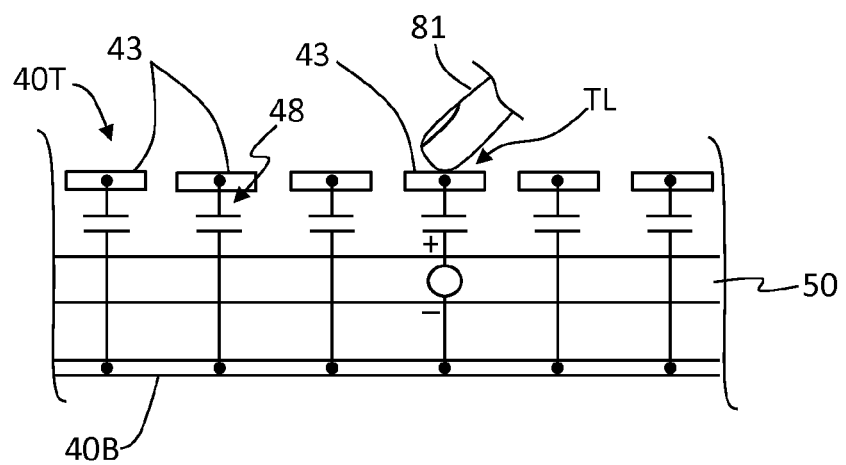
FIG. 13C is similar to FIG. 13B, but with the top conductor layer formed as shown in FIG. 13A, and illustrating the localized activation of the equivalents circuits of the structure.

FIG. 13C is similar to FIG. 13B, but shows the segmented configuration of FIG. 13A, wherein the top conducting layer 40T is divided up into the aforementioned isolated regions 43. In this case, when pressure is applied by finger 81 at a touch location TL associated with one of the isolated regions 43, only the local equivalent circuit 48 is activated, so that the resulting analog output signal SA is from only the localized region 43 associated with the touch location TL.

Figure 14:
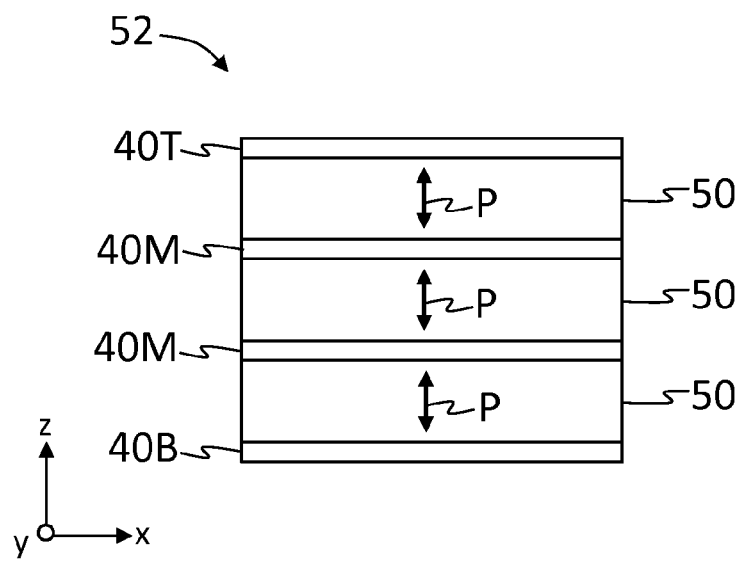
FIG. 14 is a cross-sectional view of an example piezoelectric structure that includes multiple piezoelectric layers, bottom and top conducting layers, and intermediate or middle conducting layers arranged in a stacked configuration, where the middle conducting layers are interposed between adjacent piezoelectric layers.

FIG. 14 is a cross-sectional view of an example piezoelectric structure 52 that includes multiple piezoelectric layers 50. The multiple piezoelectric layers 50, the two bottom and top conducting layers 40B and 40T, and two intermediate or middle conducting layers 40M are arranged in a stacked configuration, where the middle layers are interposed between adjacent piezoelectric layers. The piezoelectric layers 50 have the same polarization P. The bottom and top conducting layers 40B and 40T are used for signal collection transmission, while the middle layers 40M are used for strain relief.

In examples, the middle layers 40M can be made from a conducting or a non-conducting material, as long that the material is transparent and performs the required stress relief function. The middle layers 40M may also be used to perform an optical function, i.e., designed to contribute in a select way to the overall reflectance or color of the piezoelectric structure 52. The stacked configuration of piezoelectric structure 52 of FIG. 14 can be used to strengthen the analog output signal SA in cases where the output signal from a single piezoelectric layer 50 is too low or the signal processing system 83 has too much noise.

Figure 15:
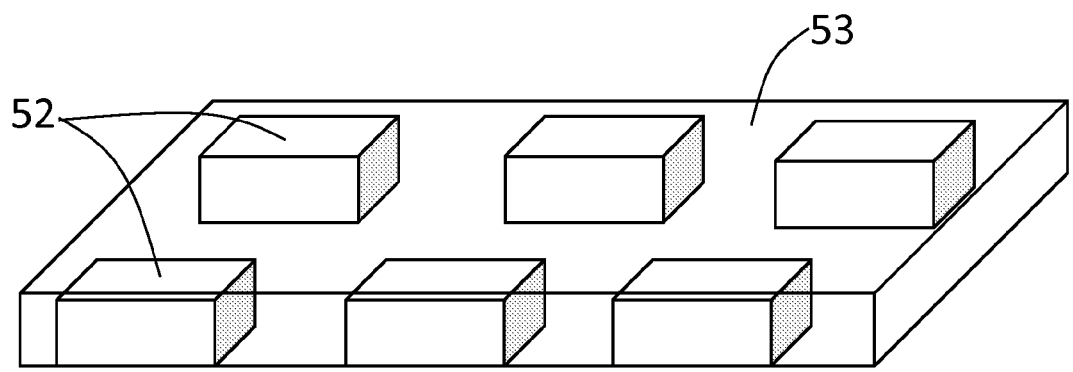
FIG. 15 is an elevated view of an array of piezoelectric structures of FIG. 14 electrically isolated by a sealing layer of a dielectric material.

FIG. 15 is an elevated view showing an array of the piezoelectric structures 52 of FIG. 14, wherein the piezoelectric structures are electrically isolated by sealing layer 53 made of a dielectric material. The configuration of FIG. 15 can be used to provide spatially-resolved touch sensing without the need to use a separate sensor for x-y position sensing.

Another advantage of the stacked configuration of the piezoelectric structure 52 of FIG. 14 is that it allows for the formation of a very thick stack with well-ordered crystal structure in cases when a single crystal of such a large thickness may be difficult to grow due to stress. The stress-relief layers 40M allow good crystal quality and common crystal orientation for all layers in the stack, for maximum net electrical polarization, and hence maximum voltage for a typical applied stress. The main orientation of the polarization P is either up or down and is common for all of the piezoelectric layers 50 in piezoelectric structure 52

Figure 16:
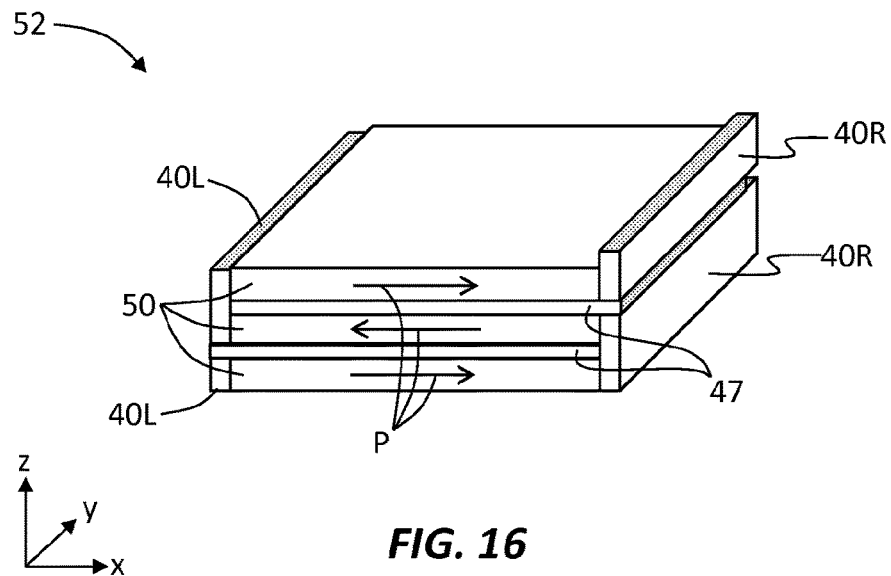
FIG. 16 is an elevated view of an example piezoelectric structure that has a stacked configuration of multiple piezoelectric layers that have alternating polarization directions that lie in the plane of the given layer.

FIG. 16 is an elevated view of an example piezoelectric structure 52 that has a stacked configuration of multiple piezoelectric layers 50, wherein the polarization directions P lie in the plane of the layer, i.e., in the x-y plane, and alternate directions (i.e., +x direction or −x direction). The piezoelectric structure 52 includes conducting electrodes 40L and 40R on the left and right sides respectively of the piezoelectric layers 50. Insulating layers 47 are used to electrically isolate adjacent piezoelectric layers 50. Like the stacked configuration of the piezoelectric structure 52 of FIG. 14, the stacked configuration of FIG. 16 can also be used to strengthen the analog output signal SA in cases where the analog output signal from a single piezoelectric layer 50 is too low to detect or has too much noise.

In the piezoelectric structure 52 of FIG. 16, each piezoelectric layer 50 has a polarization direction P in the plane of the given layer, which is normal to the direction of the stress. The predominant crystalline orientation of the c-axis is alternated between neighboring piezoelectric layers 50.

As with the piezoelectric structure 52 of FIG. 14, different stacks of piezoelectric structures 52 may be separated electrically by dielectric sealing layer 53 after the piezoelectric structure is formed and patterned. In addition, an array of piezoelectric structures 52 of FIG. 16 may be deployed to provide spatially-resolved sensing (i.e., touch-location functionality) without need to use a separate sensor for x-y position sensing.

Figure 18:
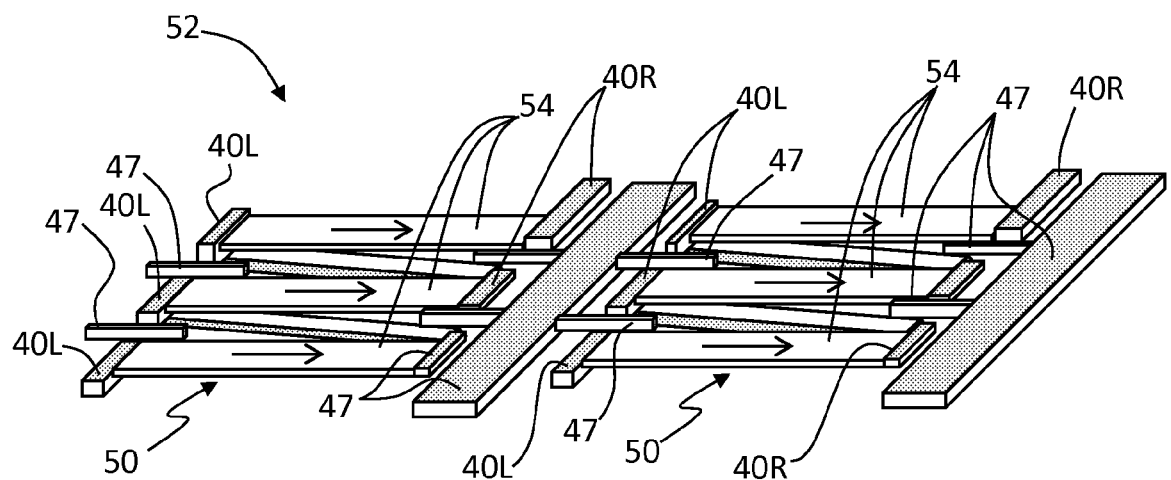
FIG. 18 is similar to FIG. 17 and illustrates an example configuration of a horizontally stacked piezoelectric structure wherein the piezoelectric layers have the same polarization direction.

FIG. 18 is an elevated view of another example piezoelectric structure 52 wherein the piezoelectric layer includes "horizontally stacked" regions 54, i.e., have a side-by-side configuration. Each region 54 of piezoelectric layer 50 has a polarization direction P in the plane of the layer, normal to the direction of the stress, i.e., in the x-y plane. The right and left conductor layers 40L and 40R reside adjacent the left and right edges of the piezoelectric regions 54.

The piezoelectric layers 50 are electrically isolated by dielectric structures 47, thereby defining regions 54. The dielectric structures 47 may be formed as a patterned dielectric using a deposition process. The dielectric structures 47 can be deposited before and after the piezoelectric layer 50, serving to seal and electrically isolate the different regions 54 of the piezoelectric layer. Combinations of the above approach can also be employed in forming the dielectric structures 47 used to electrically isolate the different regions 54 of piezoelectric layers 50. The predominant crystalline orientation of the c-axis alternates between neighboring co-planar piezoelectric layers. Multiple piezoelectric structures 52 may be deployed to provide touch-location functionality without the need to use a separate sensor for x-y position sensing.

Figure 17:
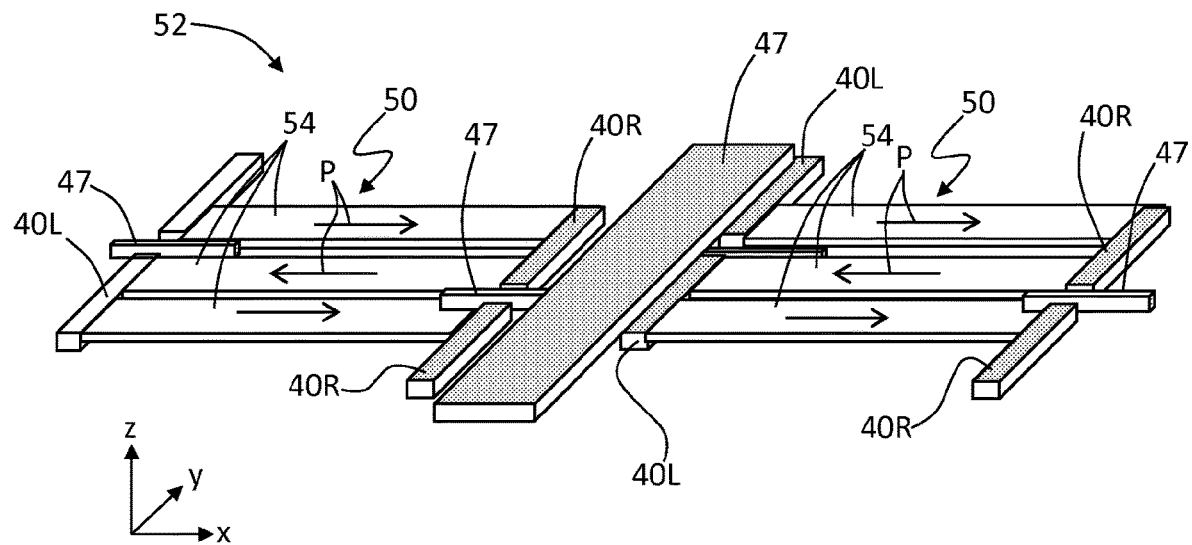
FIG. 17 is an elevated view of another example piezoelectric structure wherein the piezoelectric layers are horizontally stacked, i.e., have a side-by-side configuration.

FIG. 18 is similar to FIG. 17 and illustrates an example configuration of a piezoelectric structure 52 wherein the regions 54 of piezoelectric layer 50 have the same polarization direction P. This property requires a different configuration for the conducting layers that define the electrodes. Combinations of the above approach can also be employed in forming the dielectric structures 47 used to electrically isolate the different regions 54 of piezoelectric layer 50. Multiple piezoelectric structures 52 may be deployed to provide spatially-resolved sensing without the need to use a separate sensor for x-y position.

Display Assembly

Figure 19A:
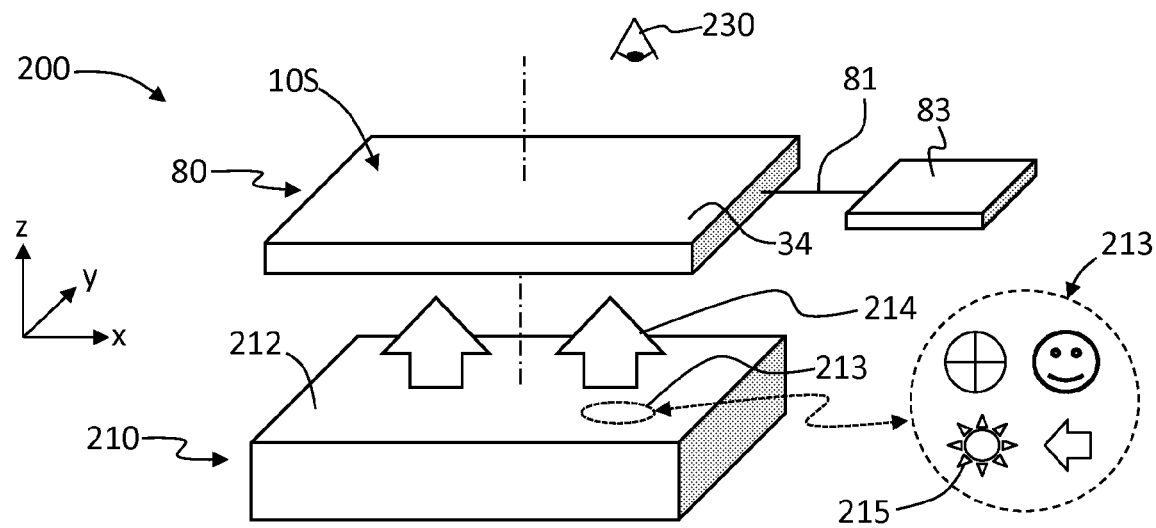
FIG. 19A is an elevated, exploded view
Figure 19B:
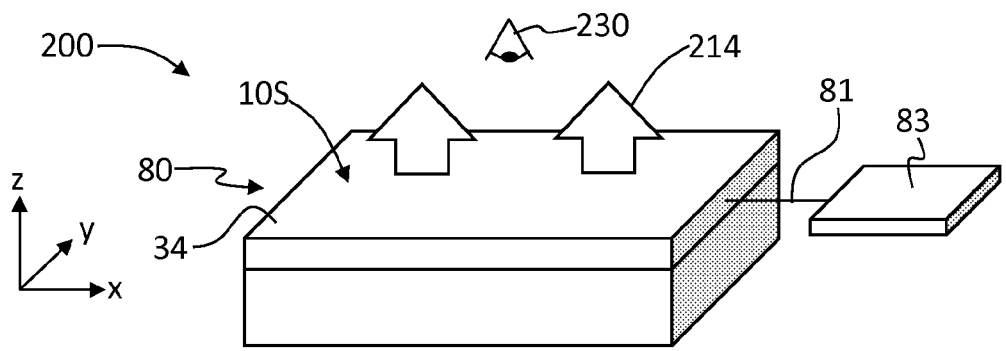
FIG. 19B is an elevated view of an example display assembly that includes the piezoelectric sensor system disclosed herein operably arranged relative to a display system.

FIG. 19A is an elevated, exploded view and FIG. 19B is an elevated view of an example display assembly 200 that includes the PE sensor system 80 disclosed herein operably arranged relative to (i.e., operably interfaced with) a device 210 having an upper surface 212. An example device 210 is a display system, which can be any system that includes a display, such as a smart phone, tablet, lap-top, television, computer monitor or display, etc. Device 210 can also be a non-display device, such as an appliance, an instrument, a machine, etc. In an example, device 210 emits light 214, which in an example represents a display image.

In an example, device 210 includes a user interface 213 that in an example includes symbology 215 (e.g., buttons, labels, indicia, icons, etc., such as shown in the close-up inset of FIG. 19A). The user interface 213 is viewed through PETS film structure 105, which provides one or more desired touch-sensing features with respect to either a non-touch-sensing or a limited-touch-sensing user interface 213 of the device 210. In an example, the user interface 213 is formed by a display, e.g., is formed as a display image. In an example, PETS film structure 10S serves as a touch-sensing display cover for device 200. In an example, the user interface 213 comprises a graphical user interface (GUI). In an example, visible light 214 is emitted through the upper surface 212 in the example where device 210 is a display system. In another example, visible light 214 is reflected from upper surface 212. In an example, visible light 214 constitutes a display image.

Figure 19C:
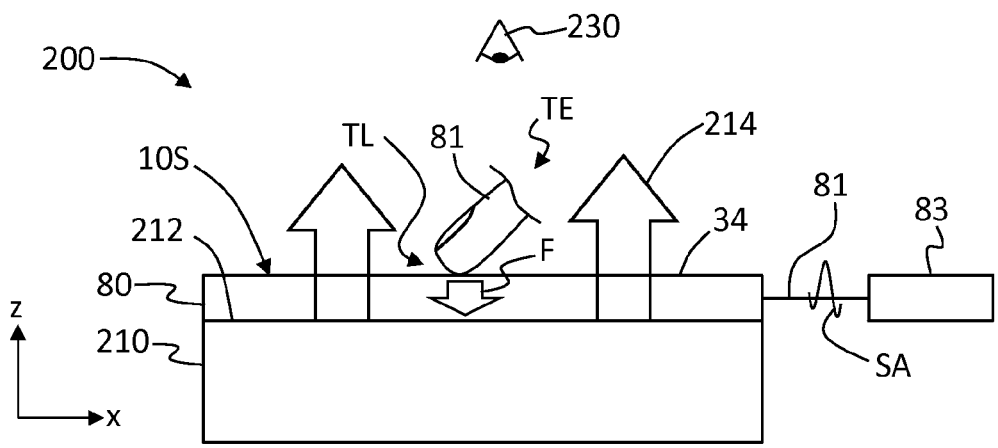
FIG. 19C is a cross-sectional view of the example display assembly of FIG. 19B, showing a touch event at a touch location and the generation of an output signal that is processed by the signal processing system to provide at least one touch-sensing function.

In an example, PE sensor system 80 includes one of the PETS film structures 10S disclosed herein that provides at least one touch-sensing feature including for example touch-location determination and pressure-sensing. FIG. 19C is a cross-sectional view of the display assembly 200 of FIG. 19B, also showing finger 81 in contact with touch surface 34, wherein the finger creates a touch event TE on PETS film structure 105 at touch location TL. Other implements other than finger 81 can be used to create touch event TE, such as a stylus, pen, pencil, etc.

In response to the touch event TE, PETS film structure 10S generates analog output signal SA that is processed by signal processor 83, which establishes at least one touch-sensing feature, including: the position of touch location TL, an amount of pressure applied at the touch location, an amount of force at the touch location, the duration of the touch event, a size of the touch location (e.g., a swiping distance or shape), an acceleration, acoustic sensing such as for a voice command, and vibrational energy harvesting.

In an example, the PETS film structure 105 can provide at least one of piezoelectric touch sensing and capacitive touch sensing. In another example, device 210 includes at least one type of touch sensing functionality other than piezoelectric touch sensing, so that the display assembly 200 includes two or more different types of touch sensing. In one example, the touch sensing provided by PE sensor system 80 does not distinguish as to the touch location and provides a measurement function associated with the touch event TE, such as pressure, force, or duration. In another example, PETS film structure 105 is configured to provide information about the touch location TL of the touch event TE, as described above. In one or more embodiments, the display assembly 200 may incorporate non-capacitive or non-electrical touch sensing methods, such as optical waveguiding, photodetecting, LCD in-cell or on-cell touch sensors, and the like.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A piezoelectric film structure that is substantially transparent to visible light, comprising:
   a transparent substrate;
   a transparent bottom optical layer disposed on and in contact with the transparent substrate and that includes one or more bottom dielectric layers;
   a transparent bottom conducting layer disposed on and in contact with the transparent bottom optical layer;
   at least one transparent piezoelectric layer disposed on or above the transparent bottom conducting layer;
   a transparent top conducting layer disposed on or above the at least one transparent piezoelectric layer; and
   a transparent top optical layer disposed on or above the transparent top conducting layer and that includes one or more top dielectric layers,
   wherein each of the transparent top and bottom optical layer includes at least one material selected from the group of materials comprising: $SiN_x$, $SiO_xN_y$, $AlN_x$, $AlO_xN_y$, $SiAl_xO_yN_z$, $SiO_2$, $SiO_x$, $Al_2O_3$, and $AlO_x$.

2. The piezoelectric film structure according to claim 1, wherein:
   the transparent top and bottom conducting layers each include one of ITO, AZO or a thin metal; and
   the transparent piezoelectric layer includes at least one piezoelectric material selected from the group of piezoelectric materials comprising: CdS, CdSe, ZnS, ZnTe, ZnO, AlN, oxygen-doped AlN, barium titanate (BaTiO$_3$), a lead-free niobate, a lead-zirconate-titanate (PZT), lead-lanthanum-zirconate-titanate (PLZT), and a lead-free titanate.

3. The piezoelectric film structure according to claim 1, wherein the transparent piezoelectric layer consists of oxygen-doped AlN having up to 20 atomic % oxygen, and optionally a thickness $TH_{50}$ in the range from 50 nm ≤ $TH_{50}$ ≤ 5000 nm.

4. The piezoelectric film structure of claim 1, having at least one of the following properties:
   i) a hardness measured by Berkovich nanoindentation greater than 8 GPa; and
   ii) a photopic average reflectance less than 2%, and an angular color shift in the range of 0 to 60 degrees light incidence of less than 5 in either a* or b* coordinates.

5. The piezoelectric film structure according to claim 1, wherein each of the top and bottom optical layer consists of a stack of high-index and low-index layers, the high-index layers having a refractive index of about 1.7 to 2.3 and the low-index layers having a refractive index of about 1.3 to 1.7, and
   further wherein the substrate comprises a thickness of greater than 0.5 mm and a thermal conductivity of greater than 1 W/m*K.

6. A piezoelectric sensor system, comprising:
   the piezoelectric film structure of claim 1, wherein the piezoelectric film structure generates an output signal in response to at least one touch event on the transparent top optical layer; and a signal processing system electrically connected to the bottom and top transparent conducting layers and that receives and processes the output signal to determine at least one touch-sensing feature associated with the at least one touch event, wherein the at least one touch-sensing feature includes for each touch event: a touch location of the touch event, an amount of pressure, an amount of force, a duration, a size, a shape, an acceleration, acoustic sensing, and vibrational energy harvesting.

7. The piezoelectric sensor system according to claim 6, wherein at least one of the transparent bottom conducting layer, the at least one transparent piezoelectric layer and the transparent top conducting layer is patterned to provide touch-location functionality for the at least one touch event.

8. A display assembly, comprising:
a device having a user interface; and
the piezoelectric sensor system according to claim 7 operably disposed relative to the device so that user interface can be viewed through the piezoelectric film structure of the piezoelectric sensor system.

9. The display assembly according to claim 8, wherein the device is a display system that emits light through the surface, wherein the light defines the user interface and travels through the piezoelectric film structure.

10. A piezoelectric film sensor having touch-sensing capability in response to a touch event at a touch location, comprising:
first and second transparent conducting layers that define first and second electrodes;
at least one transparent piezoelectric layer interposed between the first and second electrodes;
wherein the first electrode, the second electrode and the at least one transparent piezoelectric layer are configured to provide touch-location functionality and to generate an output signal in response to the touch event;
a first transparent optical layer disposed on and in contact with the first electrode and a second transparent optical layer disposed on and in contact with the second electrode, with the first transparent optical layer defining an uppermost surface, wherein the first electrode is between the substrate and the first optical layer and the second electrode is between the substrate and the second optical layer, and further wherein the first electrode and the second electrode are opposite the piezoelectric layer;
a substrate disposed adjacent the second optical layer wherein the second optical layer is disposed on and in contact with the substrate; and
a signal processing system electrically connected to the bottom and top transparent conducting layers and configured to process the output signal to determine at least one touch-sensing feature associated with the at least one touch event,
wherein each of the first and second transparent optical layer includes at least one material selected from the group of materials comprising: $SiN_x$, $SiO_xN_y$, $AlN_x$, $AlO_xN_y$, $SiAl_xO_yN_z$, $SiO_2$, $SiO_x$, $Al_2O_3$, and $AlO_x$.

11. The piezoelectric film sensor according to claim 10, wherein the at least one touch-sensing feature includes one or more of: a touch location of the touch event, an amount of pressure, an amount of force, a duration, a size, a shape, an acceleration, acoustic sensing, and vibrational energy harvesting.

12. The piezoelectric film sensor according to claim 10, wherein the transparent piezoelectric layer consists of oxygen-doped AlN having up to 20 atomic % oxygen.

13. The piezoelectric film sensor according to claim 10, wherein the output signal includes piezoelectric and pyroelectric components, and wherein the signal processing system includes one or more filters arranged to filter the output signal to substantially separate the piezoelectric component from the pyroelectric component.

14. The piezoelectric film sensor according to claim 10, wherein the at least one piezoelectric layer comprises any one of
multiple vertically stacked piezoelectric layers,
multiple horizontally stacked piezoelectric layers, and
a single continuous piezoelectric layer, wherein the first electrode is closer to the uppermost surface than the second electrode, and wherein the first electrode comprises spaced apart and electrically isolated regions that are independently electrically addressable via electrical connections to the signal processing system.

15. The piezoelectric film sensor according to claim 10, wherein each of the first and second optical layer consists of a stack of high-index and low-index layers, the high-index layers having a refractive index of about 1.7 to 2.3 and the low-index layers having a refractive index of about 1.3 to 1.7, and
further wherein the substrate comprises a thickness of greater than 0.5 mm and a thermal conductivity of greater than 1 W/m*K.

16. A display assembly, comprising:
a device having a user interface; and
the piezoelectric sensor system according to claim 10 operably disposed relative to the device so that user interface can be viewed through the piezoelectric film structure of the piezoelectric sensor system.

17. The display assembly according to claim 10, wherein the device is a display system that emits light through the surface, wherein the light defines the user interface and travels through the piezoelectric film structure.

18. A method of providing piezoelectric touch sensing for a device having a user interface, comprising:
interfacing a piezoelectric film sensor having touch-sensing capability with the device so that the user interface can be viewed through a transparent piezoelectric touch-sensing (PETS) piezoelectric film structure of the piezoelectric film sensor;
causing a touch event by touching a surface of the piezoelectric film sensor at a touch location that corresponds to a location of the user interface, thereby causing the PETS piezoelectric film structure to generate an output signal; and
processing the output signal to determine at least one touch-sensing feature associated with the touch event,
wherein the PETS piezoelectric film structure comprises a top and bottom transparent optical layer and a top and bottom electrode,
wherein the bottom transparent optical layer is disposed on and in contact with a substrate and the bottom electrode is disposed on and in contact with the bottom transparent optical layer, and
further wherein each of the top and bottom optical layer includes at least one material selected from the group of materials comprising: $SiN_x$, $SiO_xN_y$, $AlN_x$, $AlO_xN_y$, $SiAl_xO_yN_z$, $SiO_2$, $SiO_x$, $Al_2O_3$, and $AlO_x$.

19. The method of claim 18, wherein the at least one touch-sensing feature includes one or more of: the touch location, an amount of pressure applied at the touch location, an amount of force applied at the touch location, a duration of the touch event, a size of the touch location, a shape of the touch location, an acceleration, acoustic sensing, and vibrational energy harvesting.

20. The method according to claim 18, wherein each of the top and bottom optical layer consists of a stack of high-index and low-index layers, the high-index layers having a refractive index of about 1.7 to 2.3 and the low-index layers having a refractive index of about 1.3 to 1.7, and further wherein the substrate comprises a thickness of greater than 0.5 mm and a thermal conductivity of greater than 1 W/m*K.

* * * * *

UNITED STATES PATENT AND TRADEMARK OFFICE
CERTIFICATE OF CORRECTION

PATENT NO. : 10,649,588 B2
APPLICATION NO. : 15/518597
DATED : May 12, 2020
INVENTOR(S) : Amin et al.

Page 1 of 1

It is certified that error appears in the above-identified patent and that said Letters Patent is hereby corrected as shown below:

On the Title Page

On page 2, in Column 2, item (56), Other Publications, Line 5, delete "tide" and insert -- nitride --, therefor.

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*